(12) United States Patent
Kang et al.

(10) Patent No.: US 10,714,544 B2
(45) Date of Patent: Jul. 14, 2020

(54) DISPLAY DEVICE WITH INTEGRATED TOUCH SCREEN

(71) Applicant: LG Display Co., Ltd., Seoul (KR)

(72) Inventors: Yeonsuk Kang, Paju-si (KR); JoonYoung Heo, Paju-si (KR); YongBaek Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 145 days.

(21) Appl. No.: 15/642,192

(22) Filed: Jul. 5, 2017

(65) Prior Publication Data

US 2018/0182816 A1     Jun. 28, 2018

(30) Foreign Application Priority Data

Dec. 26, 2016  (KR) .................. 10-2016-0178738

(51) Int. Cl.

| | |
|---|---|
| G06F 3/041 | (2006.01) |
| H01L 27/32 | (2006.01) |
| H01L 51/52 | (2006.01) |
| G06F 3/044 | (2006.01) |
| G09G 3/3233 | (2016.01) |
| G09G 3/3266 | (2016.01) |
| G09G 3/3275 | (2016.01) |
| G09G 3/3225 | (2016.01) |

(52) U.S. Cl.
CPC .......... *H01L 27/323* (2013.01); *G06F 3/044* (2013.01); *G06F 3/0412* (2013.01); *G06F 3/0414* (2013.01); *G06F 3/0416* (2013.01); *H01L 27/322* (2013.01); *H01L 51/5271* (2013.01); *H01L 51/5281* (2013.01); *H01L 51/5284* (2013.01); *G06F 2203/04103* (2013.01); *G06F 2203/04111* (2013.01); *G09G 3/3225* (2013.01); *G09G 3/3233* (2013.01); *G09G 3/3266* (2013.01); *G09G 3/3275* (2013.01); *G09G 2310/08* (2013.01); *H01L 27/3244* (2013.01)

(58) Field of Classification Search
None
See application file for complete search history.

(56) References Cited

U.S. PATENT DOCUMENTS

| | | |
|---|---|---|
| 2011/0220924 A1 | 9/2011 | Fukuda |
| 2012/0097990 A1 | 4/2012 | Koh et al. |
| 2013/0135224 A1* | 5/2013 | Lee .................. G06F 3/044 345/173 |
| 2013/0194196 A1 | 8/2013 | Lai |

(Continued)

FOREIGN PATENT DOCUMENTS

| | | |
|---|---|---|
| CN | 103439818 A | 12/2013 |
| JP | 2004-265752 A | 9/2004 |

(Continued)

*Primary Examiner* — Brian M Butcher
(74) *Attorney, Agent, or Firm* — Fenwick & West LLP

(57) ABSTRACT

Disclosed is a display device with integrated touch screen, in which a resistance of a touch electrode is reduced by using a black matrix. The display device includes an organic light emitting device layer disposed on a substrate, a plurality of color filters disposed on the organic light emitting device layer, a black matrix disposed to overlap a boundary portion between the plurality of color filters and including a three or more-layered metal layer, and a plurality of first touch electrodes and a plurality of second touch electrodes disposed on the black matrix.

33 Claims, 17 Drawing Sheets

(56) References Cited

U.S. PATENT DOCUMENTS

2014/0061597 A1   3/2014   Choi et al.
2015/0060817 A1   3/2015   Sato et al.
2015/0138480 A1   5/2015   Yi et al.
2016/0098140 A1   4/2016   Lee et al.

FOREIGN PATENT DOCUMENTS

| | | |
|---|---|---|
| JP | 2007-134345 A | 5/2007 |
| JP | 2007-171647 A | 7/2007 |
| JP | 2009-059809 A | 3/2009 |
| JP | 2014-049436 A | 3/2014 |
| JP | 2015-050245 A | 3/2015 |

\* cited by examiner

DISPLAY DEVICE WITH INTEGRATED TOUCH SCREEN

CROSS-REFERENCE TO RELATED APPLICATIONS

This application claims priority under 35 U.S.C. § 119(a) of Republic of Korea Patent Application No. 10-2016-0178738, filed on Dec. 26, 2016, which is hereby incorporated by reference in its entirety.

BACKGROUND

Technical Field

The present disclosure relates to a display device with integrated touch screen.

Discussion of the Related Art

With the advancement of information-oriented society, various requirements for display devices for displaying an image are increasing. Therefore, various display devices such as liquid crystal display (LCD) devices, plasma display panels (PDPs), and organic light emitting display devices are being used recently. In such display devices, the organic light emitting display devices are driven with a low voltage and have characteristics such as thinness, an wide viewing angle, a fast response speed, etc.

The organic light emitting display devices each include a display panel which includes a plurality of data lines, a plurality of scan lines, and a plurality of pixels provided in a plurality of pixel areas defined by intersections of the data lines and the scan lines, a scan driver which supplies scan signals to the scan lines, and a data driver which supplies data voltages to the data lines. Each of the pixels includes an organic light emitting device, a driving transistor which controls the amount of current supplied to the organic light emitting device according to a voltage of a gate electrode, and a scan transistor which supplies a data voltage of a corresponding data line to the gate electrode of the driving transistor in response to a scan signal of a corresponding scan line.

Recently, the organic light emitting display devices are implemented as a display device with integrated touch screen including a touch screen panel capable of sensing a touch of a user. In this case, the organic light emitting display devices function as a touch screen device. Recently, a touch screen device is applied to monitors such as navigations, industrial terminals, notebook computers, financial automation equipment, and game machines, portable terminals such as portable phones, MP3 players, PDAs, PMPs, PSPs, portable game machines, DMB receivers, and tablet personal computers (PCs), and home appliances such as refrigerators, microwave ovens, and washing machines. Since all users can easily manipulate the touch screen device, the application of the touch screen device is being progressively expanded.

SUMMARY

Accordingly, the present disclosure is directed to provide a display device with integrated touch screen that substantially obviates one or more problems due to limitations and disadvantages of the related art.

An aspect of the present disclosure is directed to provide a display device with integrated touch screen, in which a distance between an organic light emitting layer and a black matrix is minimized or reduced.

Another aspect of the present disclosure is directed to provide a display device with integrated touch screen, in which a thickness is minimized or reduced.

Another aspect of the present disclosure is directed to provide a display device with integrated touch screen, in which a contrast ratio is enhanced.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a display device with integrated touch screen, the display device including an organic light emitting device layer disposed on a substrate, a plurality of color filters disposed on the organic light emitting device layer, a black matrix disposed to overlap a boundary portion between the plurality of color filters and including a three or more-layered metal layer, and a plurality of first touch electrodes and a plurality of second touch electrodes disposed on the black matrix.

It is to be understood that both the foregoing general description and the following detailed description of the present disclosure are explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
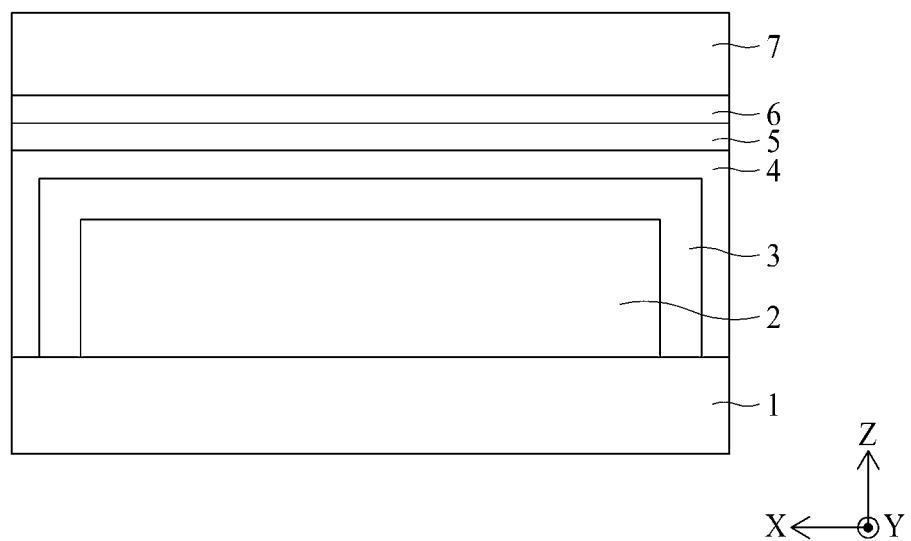
FIG. 1 is a cross-sectional view illustrating a related art display device with integrated touch screen according to an embodiment.

Reference will now be made in detail to embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

An X axis direction, a Y axis direction, and a Z axis direction should not be construed as only a geometric relationship where a relationship therebetween is strictly vertical, and may denote having a broader directionality within a scope where elements of the present disclosure operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Some embodiments may be described using the expression "connected." For example, some embodiments may be described using the term "connected" to indicate that two or more elements are in direct physical or electrical contact. The term "connected," however, may also mean that two or more elements are not in direct contact with each other, but yet still co-operate or interact with each other. The embodiments are not limited in this context unless otherwise explicitly stated.

Hereinafter, embodiments of the present disclosure will be described in detail with reference to the accompanying drawings.

FIG. 1 is a cross-sectional view illustrating a related art display device with integrated touch screen according to an embodiment.

Referring to FIG. 1, the related art display device with integrated touch screen includes a first substrate 1, a second substrate 7, an organic light emitting device layer 2, an encapsulation layer 3, an adhesive layer 4, a touch sensing layer 5, and a color filter layer 6.

In the related art display device with integrated touch screen, the first substrate 1 is adhered to the second substrate 7 by the adhesive layer 4. In this case, the organic light emitting device layer 2 and the encapsulation layer 3 covering the organic light emitting device layer 2 are formed on the first substrate 1, and the touch sensing layer 5 and the color filter layer 6 are formed on the second substrate 7.

The related art display device with integrated touch screen has a problem where its thickness is increased by the adhesive layer 4 disposed between the first substrate 1 and the second substrate 7.

Moreover, the related art display device with integrated touch screen has another problem where a distance between the organic light emitting device layer 2 and the color filter layer 6 increases due to the adhesive layer 4 disposed between the first substrate 1 and the second substrate 7. For these reasons, the related art display device with integrated touch screen has the following problems.

Figure 2A:
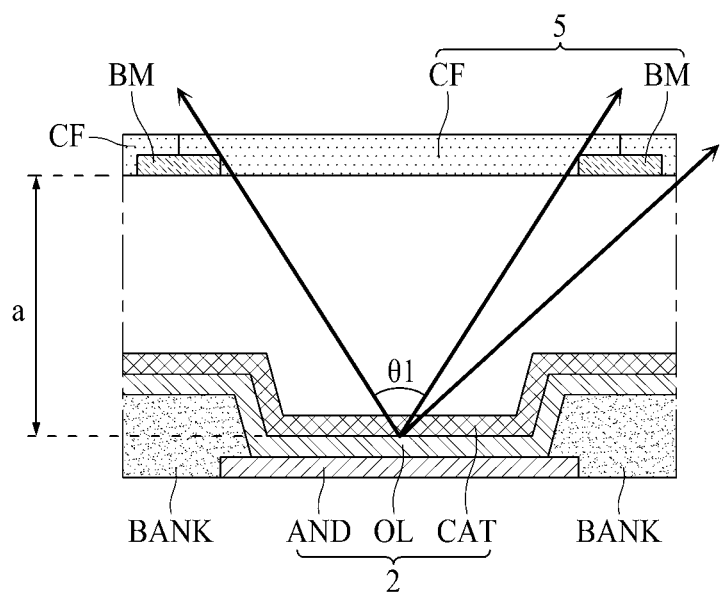
FIGS. 2A and 2B are diagrams illustrating a luminance viewing angle and occurrence of color mixture based on a distance between an organic light emitting device layer and a color filter layer according to an embodiment.
Figure 2B:
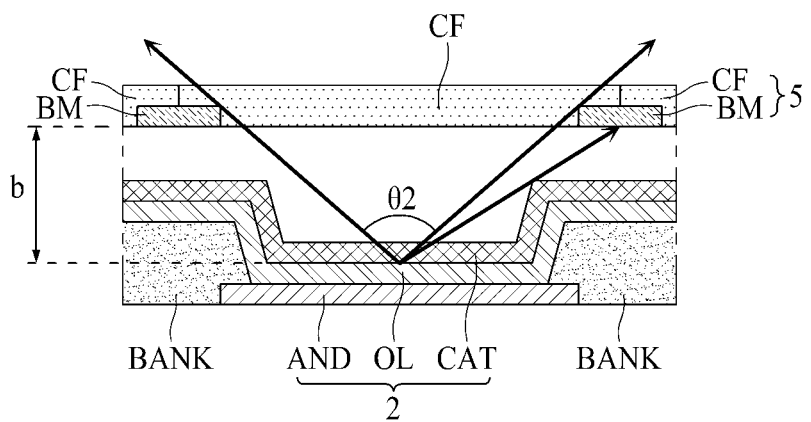

FIGS. 2A and 2B are diagrams illustrating a luminance viewing angle and occurrence of color mixture based on a distance between the organic light emitting device layer 2 and the color filter layer 6 according to an embodiment. For convenience of description, FIGS. 2A and 2B schematically illustrate only the organic light emitting device layer 2 and the color filter layer 6.

In FIG. 2A, when a distance between an organic light emitting layer OL of the organic light emitting device layer 2 and a black matrix BM of the color filter layer 6 is "a", color mixture may occur and a luminance viewing angle may decrease due to the organic light emitting device layer 2. In FIG. 2B, when the distance between the organic light emitting layer OL of the organic light emitting device layer 2 and the black matrix BM of the color filter layer 6 is "b", color mixture may not occur and a luminance viewing angle may not decrease due to the organic light emitting device layer 2. The distance "a" is greater than the distance "b". The organic light emitting device layer 2 includes an anode electrode AND, the organic light emitting layer OL, and a cathode electrode CAT.

Referring to FIGS. 2A and 2B, when the distance between the organic light emitting layer OL and the black matrix BM is "a", color mixture occurs, where light emitted from the organic light emitting layer OL of one pixel travels to a color filter CF of an adjacent pixel without being blocked by the black matrix BM. However, when the distance between the organic light emitting layer OL and the black matrix BM is "b", color mixture may hardly occur, due to light being blocked by the black matrix BM.

Moreover, when the distance between the organic light emitting layer OL and the black matrix BM is "a", light emitted from the organic light emitting layer OL is output at a first angle "θ1", but when the distance between the organic light emitting layer OL and the black matrix BM is "b", the light emitted from the organic light emitting layer OL is output at a second angle "θ2" greater than the first angle "θ1".

That is, as the distance between the organic light emitting layer OL of the organic light emitting device layer 2 and the black matrix BM of the color filter layer 6 increases, color mixture occurs and a luminance viewing angle and a color viewing angle are reduced.

Moreover, the related art display device with integrated touch screen may include a polarizer for preventing image quality from being degraded by light incident from the outside. In this case, due to the polarizer, the related art display device with integrated touch screen has a problem where a thickness is increased. Also, because external light is reflected by the polarizer, a screen looks like a mirror in outdoor environments, and for this reason, the related art display device with integrated touch screen has another problem where image visibility is reduced in outdoor environments.

Figure 3:
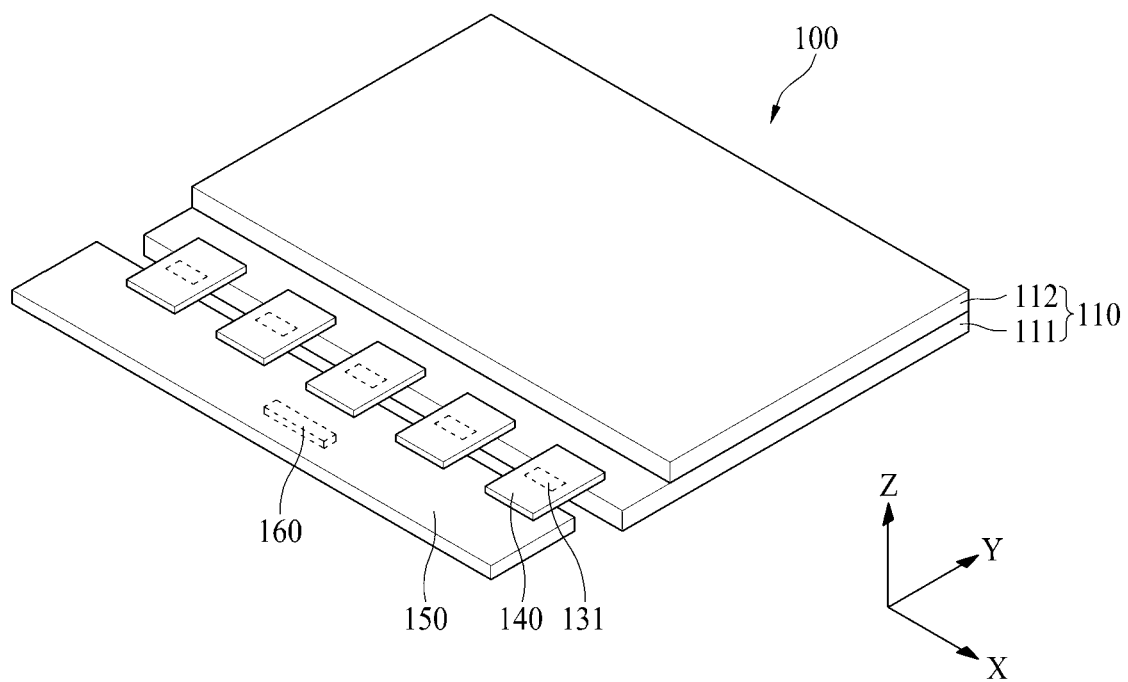
FIG. 3 is a perspective view illustrating a display device with integrated touch screen according to an embodiment of the present disclosure.
Figure 4:
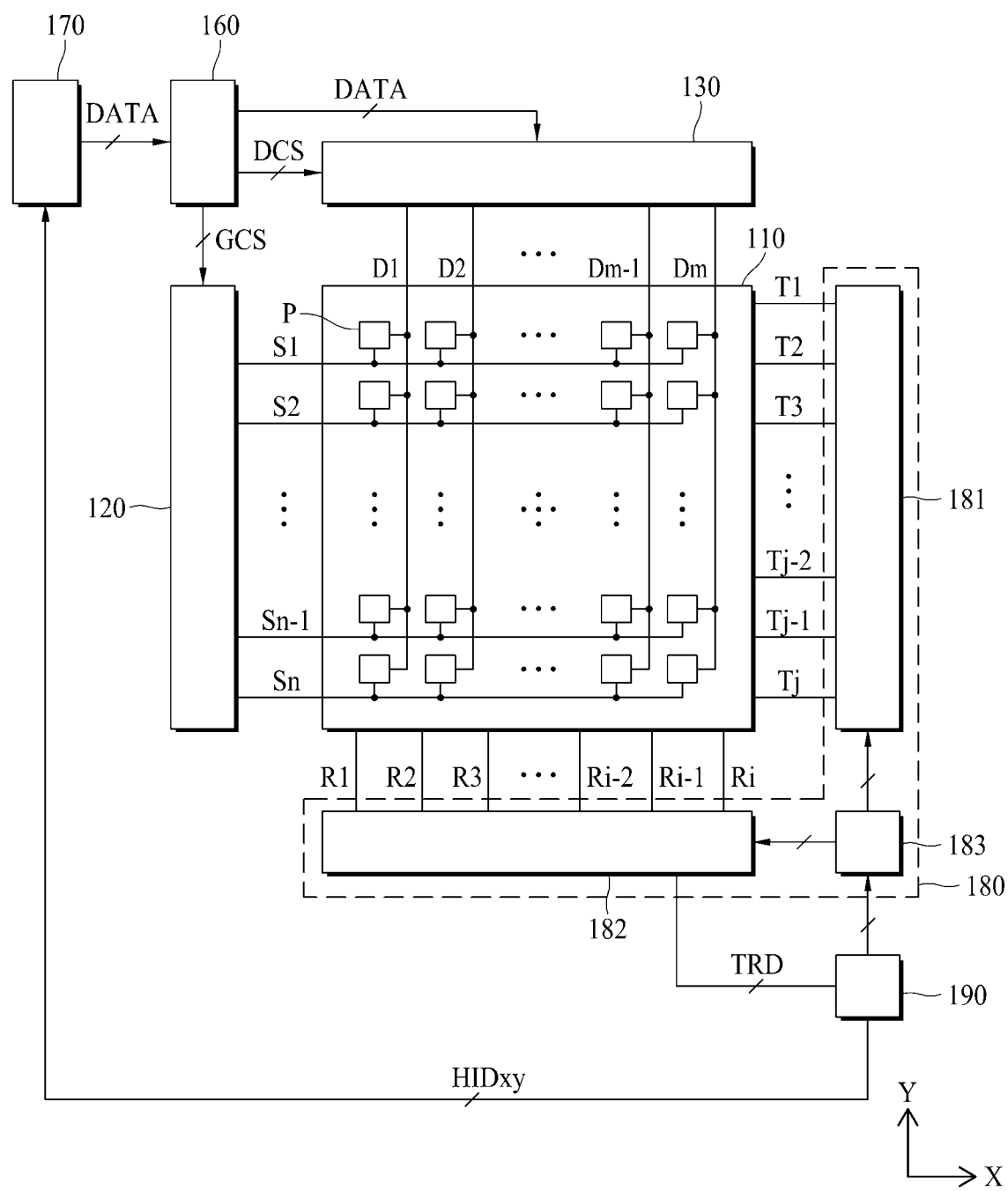
FIG. 4 is a block diagram illustrating a display device with integrated touch screen according to an embodiment of the present disclosure.

FIG. 3 is a perspective view illustrating a display device 100 with integrated touch screen according to an embodiment of the present disclosure. FIG. 4 is a block diagram illustrating a display device with integrated touch screen according to an embodiment of the present disclosure.

Referring to FIGS. 3 and 4, the display device 100 with integrated touch screen according to an embodiment of the present disclosure may include a display panel 110, a scan driver 120, a data driver 130, a timing controller 160, a host system 170, a touch driver 180, and a touch coordinate calculator 190.

The display device with integrated touch screen according to an embodiment of the present disclosure may be implemented as a flat panel display device such as an LCD device, a field emission display (FED) device, a PDP, an organic light emitting display device, an electrophoresis (EPD) device, or the like. In this disclosure below, an example where the display device with integrated touch screen according to an embodiment of the present disclosure is implemented as an organic light emitting display device will be described, but the present embodiment is not limited thereto.

The display panel 110 may include a first substrate 111 and a second substrate 112. The second substrate 112 may be an encapsulation substrate. The first substrate 111 may be a plastic film, a glass substrate, or the like. The second substrate 112 may be a plastic film, a glass substrate, an encapsulation film (a protective film), or the like.

The display panel 110 may include a display area where a plurality of pixels P are provided to display an image. A plurality of data lines D1 to Dm (where m is a positive integer equal to or more than two) and a plurality of scan lines S1 to Sn (where n is a positive integer equal to or more than two) may be arranged in the display panel 110. The data lines D1 to Dm and the scan lines S1 to Sn may be arranged to intersect each other. The pixels P may be respectively provided in a plurality of pixel areas defined by an intersection structure of the data lines and the scan lines.

Each of the pixels P of the display panel 110 may be connected to one of the data lines D1 to Dm and one of the scan lines S1 to Sn. Each of the pixels P of the display panel 110 may include a driving transistor which controls a drain-source current according to a data voltage applied to a gate electrode of the driving transistor, a scan transistor which is turned on by a scan signal of a corresponding scan line and supplies a data voltage of a corresponding data line to the gate electrode of the driving transistor, an organic light emitting diode (OLED) which emits light according to the drain-source current of the driving transistor, and a capacitor which stores a voltage of the gate electrode of the driving transistor. Therefore, each of the pixels P may emit light according to a current supplied to the OLED.

The scan driver 120 may receive a scan control signal GCS from the timing controller 160. The scan driver 120 may supply scan signals to the scan lines S1 to Sn according to the scan control signal GCS.

The scan driver 120 may be provided in a non-display area outside one side or each of both sides of the display area of the display panel 110 in a gate driver in panel (GIP) type. Alternatively, the scan driver 120 may be manufactured as a driving chip, mounted on a flexible film, and attached on the non-display area outside the one side or each of the both sides of the display area of the display panel 110 in a tape automated bonding (TAB) type.

The data driver 130 may receive digital video data DATA and a data control signal DCS from the timing controller 160. The data driver 130 may convert the digital video data DATA into analog positive/negative data voltages according to the data control signal DCS and may supply the data voltages to the data lines. That is, pixels to which the data voltages are to be supplied may be selected by the scan signals of the scan driver 120, and the data voltages may be supplied to the selected pixels.

The data driver 130, as illustrated in FIG. 3, may include a plurality of source drive ICs 131. Each of the plurality of source drive ICs 131 may be mounted on a flexible film 140 in a chip-on film (COF) type or a chip-on plastic (COP) type. The flexible film 140 may be attached on pads provided in the non-display area of the display panel 110 by using an anisotropic conducting film, and thus, the source drive ICs 131 may be connected to the pads.

The flexible film 140 may be provided in plurality, and a circuit board 150 may be attached on the plurality of flexible films 140. A plurality of circuits which are implemented as a plurality of driving chips may be mounted on the circuit board 150. For example, the timing controller 160 may be mounted on the circuit board 150. The circuit board 150 may be a printed circuit board (PCB) or a flexible printed circuit board (FPCB).

The timing controller 160 may receive the digital video data DATA and timing signals from the host system 170. The timing signals may include a vertical synchronization signal, a horizontal synchronization signal, a data enable signal, a dot clock, etc. The vertical synchronization signal may be a signal that defines one frame period. The horizontal synchronization signal may be a signal that defines one horizontal period necessary for supplying data voltages to pixels of one horizontal line of the display panel 110. The data enable signal may be a signal that defines a period where valid data is input. The dot clock may be a signal that is repeated at a certain period.

The timing controller 160 may generate the data control signal DCS for controlling an operation timing of the data driver 130 and the scan control signal GCS for controlling an operation timing of the scan driver 120 based on the timing signals, for the operation timing of each of the scan driver 120 and the data driver 130. The timing controller 160 may output the scan control signal GCS to the scan driver 120 and may output the digital video data DATA and the data control signal DCS to the data driver 130.

The host system 170 may be implemented as a navigation system, a set-top box, a DVD player, a blue-ray player, a personal computer (PC), a home theater system, a broadcasting receiver, a phone system, or the like. The host system 170 may include a system-on chip (SoC) with a built-in scaler and may convert the digital video data DATA of an input image into a format suitable for displaying the image on the display panel 110. The host system 170 may transmit the digital video data DATA and the timing signals to the timing controller 160.

In addition to the data lines D1 to Dm and the scan lines S1 to Sn, a plurality of first and second touch electrodes may be provided in the display panel 110. The first touch electrodes may be provided to intersect the second touch electrodes. The first touch electrodes may be connected to a first touch driver 181 through a plurality of first touch lines T1 to Tj (where j is a positive integer equal to or more than two). The second touch electrodes may be connected to a second touch driver 182 through a plurality of second touch lines R1 to Ri (where i is a positive integer equal to or more than two). A plurality of touch sensors may be respectively provided in intersection portions of the first touch electrodes and the second electrodes. In an embodiment of the present disclosure, each of the touch sensors is implemented with a mutual capacitor, but is not limited thereto. The first and second touch electrodes will be described later in detail with reference to FIG. 6.

The touch driver 180 may supply a driving pulse to the first touch electrodes through the first touch line T1 to Tj and may sense charging variation amounts of the touch sensors through the second touch lines R1 to Ri. That is, in FIG. 4, it is described that the first touch line T1 to Tj are Tx lines through which the driving pulse is supplied, and the second touch lines R1 to Ri are Rx lines through which the charging variation amounts of the touch sensors are sensed, in one embodiment.

The touch driver 180 may include a first touch driver 181, a second touch driver 182, and a touch controller 183. The first touch driver 181, the second touch driver 182, and the touch controller 183 may be integrated into one readout integrated chip (ROIC).

The first touch driver 181 may select a first touch line, through which the driving pulse is to be output, according to control by the touch controller 183 and may supply the driving pulse to the selected first touch line. For example, the driving pulse may be provided in plurality, and the first touch driver 181 may sequentially supply the driving pulses to the first touch lines T1 to Tj.

The second touch driver 182 may select second touch lines, through which charging variation amounts of touch sensors are to be received, according to control by the touch controller 183 and may receive the charging variation amounts of the touch sensors through the selected second touch lines. The second touch driver 182 may sample the charging variation amounts of the touch sensors received through the second touch lines R1 to Rj to convert the charging variation amounts into touch raw data TRD which are digital data.

The touch controller 183 may generate a Tx setup signal for setting a first touch line, to which the driving pulse is to be output from the first touch driver 181, and an Rx setup signal for setting a second touch line through which a touch sensor voltage is to be received from the second touch driver 182. Also, the touch controller 183 may generate timing control signals for controlling the operation timings of the first touch driver 181 and the second touch driver 182.

The touch coordinate calculator 190 may receive the touch raw data TRD from the touch driver 180. The touch coordinate calculator 190 may calculate touch coordinates, based on a touch coordinate calculation method and may output touch coordinate data HIDxy, including information about the touch coordinates, to the host system 170.

The touch coordinate calculator 190 may be implemented with a micro controller unit (MCU). The host system 170 may analyze the touch coordinate data HIDxy input from the touch coordinate calculator 190 to execute an application program associated with coordinates where a touch has been performed by a user. The host system 170 may transmit the digital video data DATA and the timing signals to the timing controller 160 according to the executed application program.

The touch driver 180 may be included in the source drive ICs 131, or may be manufactured as a separate driving chip and mounted on the circuit board 150. Also, the touch coordinate calculator 190 may be manufactured as a separate driving chip and mounted on the circuit board 150.

Figure 5:
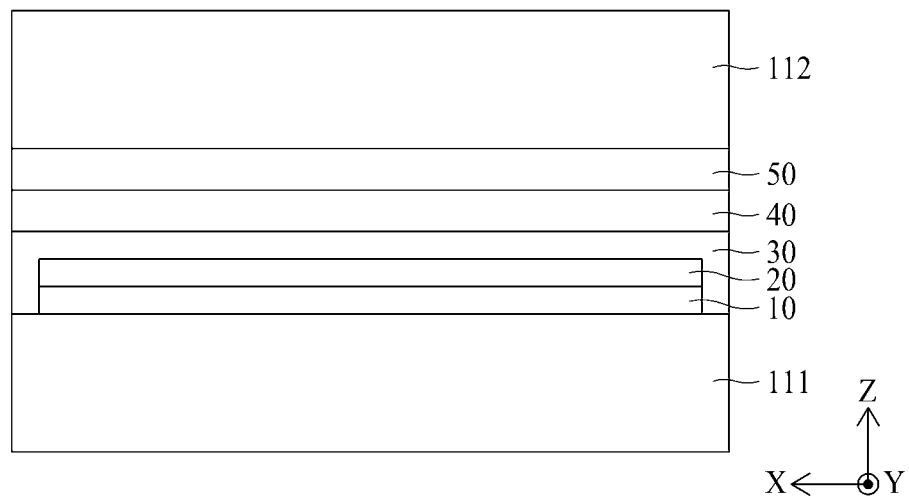
FIG. 5 is a cross-sectional view illustrating one side of a display panel shown in FIG. 3 according to an embodiment.

FIG. 5 is a cross-sectional view illustrating one side of the display panel 110 shown in FIG. 3 according to an embodiment.

Referring to FIG. 5, the display panel 110 may include a first substrate 111, a second substrate 112, and a thin film transistor (TFT) layer 10, an organic light emitting device layer 20, an encapsulation layer 30, a color filter layer 40, and a touch sensing layer 50 disposed between the first and second substrates 111 and 112.

The first substrate 111 may be a plastic film, a glass substrate, or the like.

The TFT layer 10 may be formed on the first substrate 111. The TFT layer 10 may include the scan lines, the data lines, and a plurality of TFTs. The TFTs may each include a gate electrode, a semiconductor layer, a source electrode, and a drain electrode. In embodiments where the scan driver is provided in the GIP type, the scan driver may be provided along with the TFT layers 10.

The organic light emitting device layer 20 may be formed on the TFT layer 10. The organic light emitting device layer 20 may include a first electrode, an organic light emitting layer, a second electrode, and a bank. The organic light emitting layer may include a hole transporting layer, a light emitting layer, and an electron transporting layer. In one embodiment, when a voltage is applied to the first electrode and the second electrode, a hole and an electron move to the light emitting layer through the hole transporting layer and the electron transporting layer and are combined with each other in the light emitting layer to emit light. Since the pixels are provided in an area where the organic light emitting device layer 20 is formed, the area where the organic light emitting device layer 20 is formed may be defined as a display area. A peripheral area of the display area may be defined as a non-display area.

The encapsulation layer 30 may be formed on the organic light emitting device layer 20. The encapsulation layer 30 prevents oxygen or water from penetrating into the organic light emitting device layer 20. The encapsulation layer 30 may include at least one inorganic layer.

The color filter layer 40 may be formed on the encapsulation layer 30. The color filter layer 40 may include a plurality of color filters and a black matrix. In this case, the black matrix may be formed of a metal multilayer. Cross-sectional structure of the color filter layer 40 will be described below in detail with reference to FIGS. 8 to 16.

The touch sensing layer 50 may be formed on the color filter layer 40. The touch sensing layer 50 may include first and second touch electrodes for sensing a user touch. A plane structure of the touch sensing layer 50 will be described below with reference to FIGS. 6 and 7. Also, cross-sectional structure of the touch sensing layer 50 will be described below in detail with reference to FIGS. 8 to 16.

The second substrate 112 may be provided on the touch sensing layer 50. The second substrate 112 may act as a cover substrate or a cover window which covers the first substrate 111. The second substrate 112 may be a plastic film, a glass substrate, an encapsulation film (a protective film), or the like, but is not limited thereto.

Figure 6:
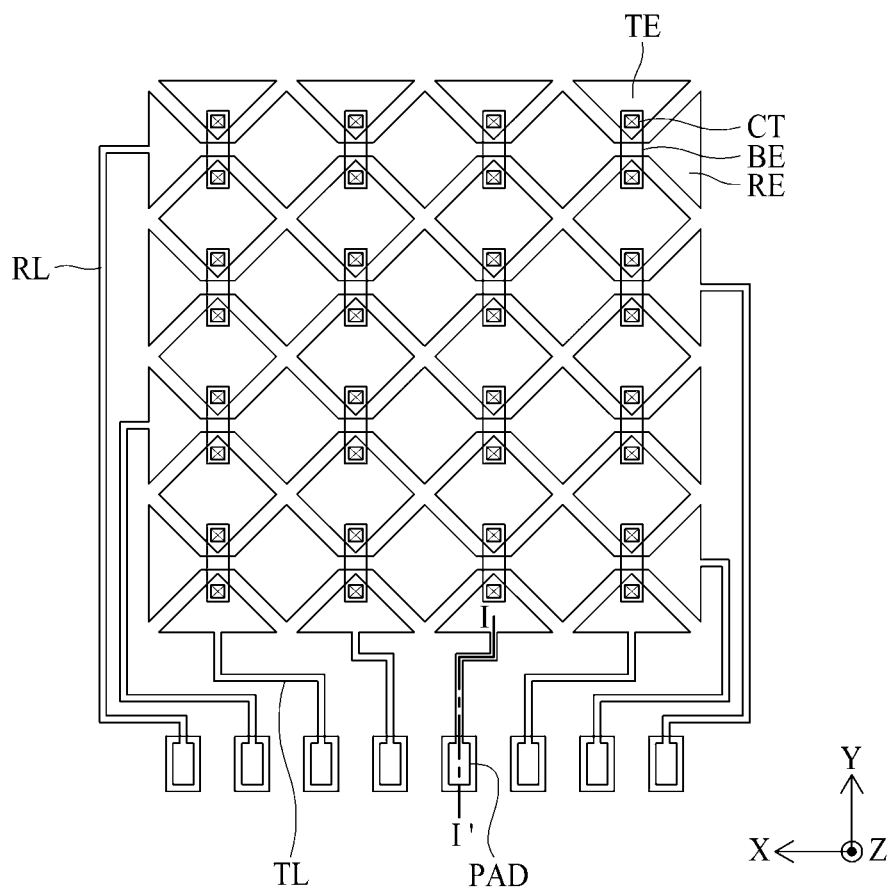
FIG. 6 is a plan view illustrating a touch sensing layer of the display device shown in FIG. 3 according to an embodiment.

FIG. 6 is a plan view illustrating the touch sensing layer 50 of the display device 100 shown in FIG. 3 according to an embodiment.

Referring to FIG. 6, the touch sensing layer 50 may include a plurality of first touch electrodes TE, a plurality of second touch electrodes RE, and a plurality of bridge electrodes BE. The first touch electrodes TE may be arranged in a first direction (a Y-axis direction) and connected to each other, and the second touch electrodes RE may be arranged in a second direction (an X-axis direction) and connected to each other. The first direction (the Y-axis direction) may be a direction parallel to the scan lines S1 to Sn, and the second direction (the X-axis direction) may be a direction parallel to the data lines D1 to Dm. Alternatively, the first direction (the Y-axis direction) may be a direction parallel to the data lines D1 to Dm, and the second direction (the X-axis direction) may be a direction parallel to the scan lines S1 to Sn.

In order to prevent the first touch electrodes TE and the second touch electrodes RE from being short-circuited in intersection areas therebetween, the first touch electrodes TE which are adjacent to each other in the first direction may be electrically connected to each other through the bridge electrodes BE. The bridge electrodes BE may be disposed on a layer different from a layer on which the first and second touch electrodes TE and RE are disposed, and may be connected to, through contact portions CT, the first touch electrodes TE adjacent to each other. The bridge electrodes BE may intersect (e.g., vertically overlap but not physically contact) the second touch electrodes RE.

Each of first touch electrodes TE connected to each other in the first direction may be electrically insulated from first touch electrodes TE adjacent thereto in the second direction. Each of second touch electrodes RE connected to each other in the second direction may be electrically insulated from second touch electrodes RE adjacent thereto in the first direction.

Therefore, a mutual capacitor corresponding to a touch sensor may be provided in an intersection area of a first touch electrode TE and a second touch electrode RE.

First touch electrodes TE disposed in one side end among first touch electrodes TE connected to each other in the first direction may be connected to a first touch line TL. The first touch line TL may be connected to the first touch driver 181 through a pad 330. The pad 330 is connected to a link line 350 (shown in FIG. 12) connected to the first touch driver 181. Therefore, the first touch electrodes TE connected to each other in the first direction may receive the driving pulse from the first touch driver 181 through the first touch line TL.

Second touch electrodes RE disposed in one side end among second touch electrodes RE connected to each other in the second direction may be connected to a second touch line RL. The second touch line RL may be connected to the second touch driver 182 through a pad 330. The pad 330 is connected to a link line 350 connected to the second touch driver 182. Therefore, the second touch driver 182 may receive charging variation amounts of touch sensors from the second touch electrodes RE connected to each other in the second direction.

Figure 7:
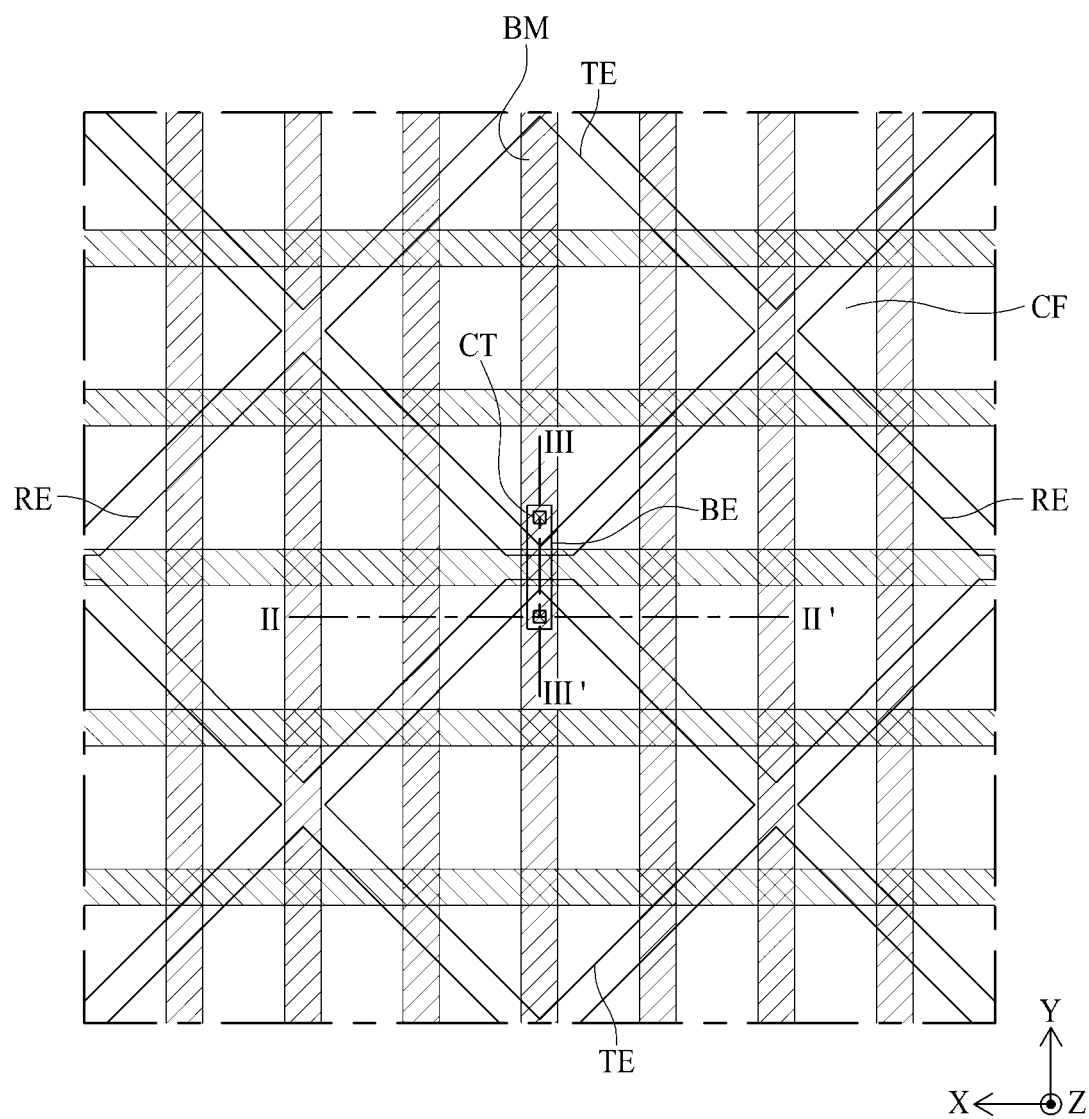
FIG. 7 is an enlarged plan view of a touch sensing layer and a color filter layer of the display device shown in FIG. 3 according to an embodiment.
Figure 8:
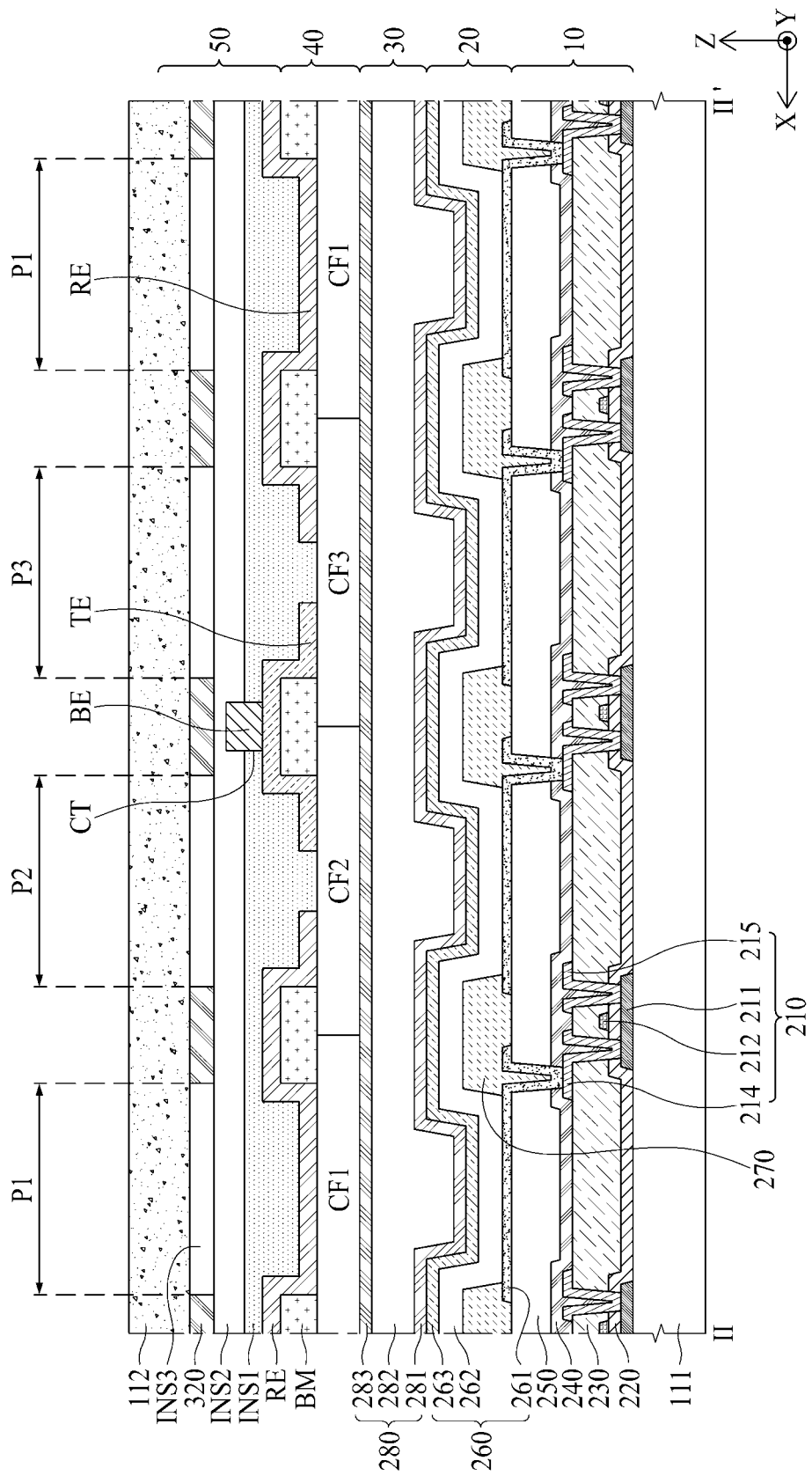
FIG. 8 is a cross-sectional view of the display device shown in FIG. 7 taken along line □-□' according to an embodiment.
Figure 9:
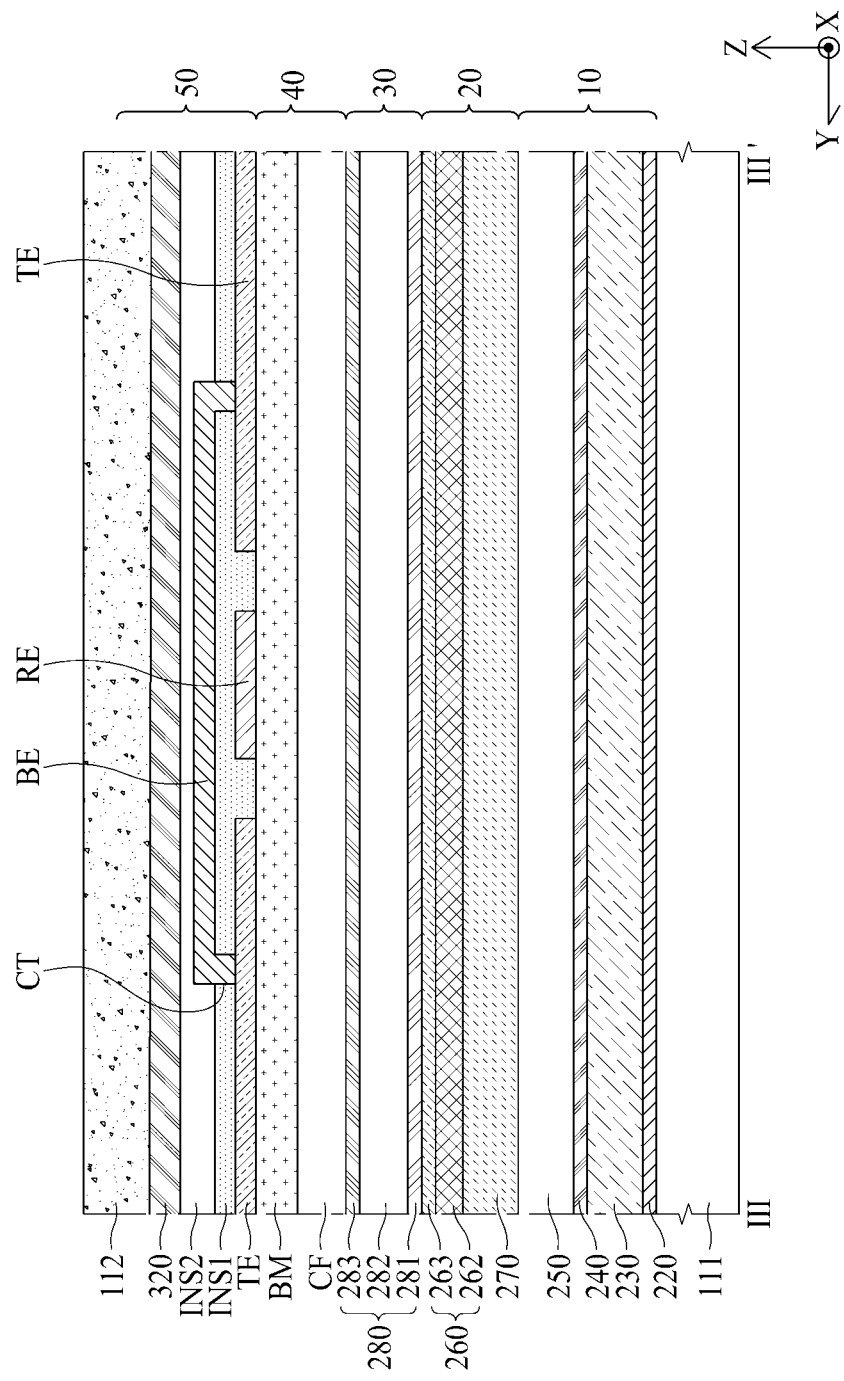
FIG. 9 is a cross-sectional view of the display device shown in FIG. 7 taken along line □-□' according to an embodiment.
Figure 10A:
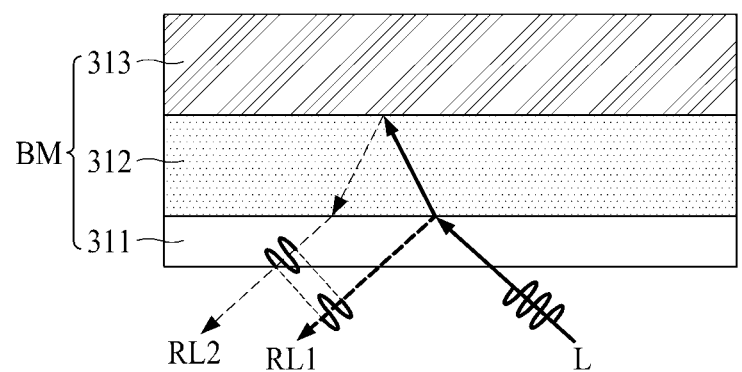
FIG. 10A is a cross-sectional view illustrating an example of a black matrix according to an embodiment.
Figure 10B:
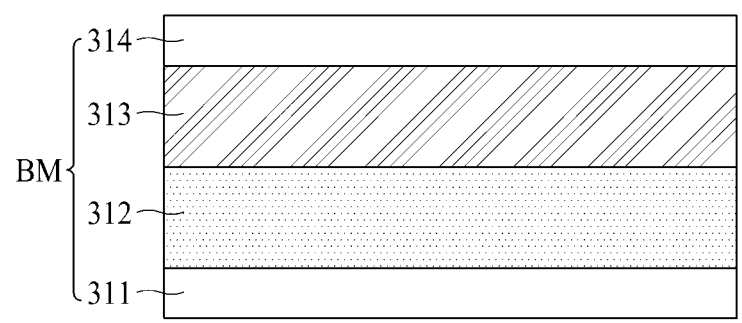
FIG. 10B is a cross-sectional view illustrating another example of a black matrix according to an embodiment.
Figure 11:
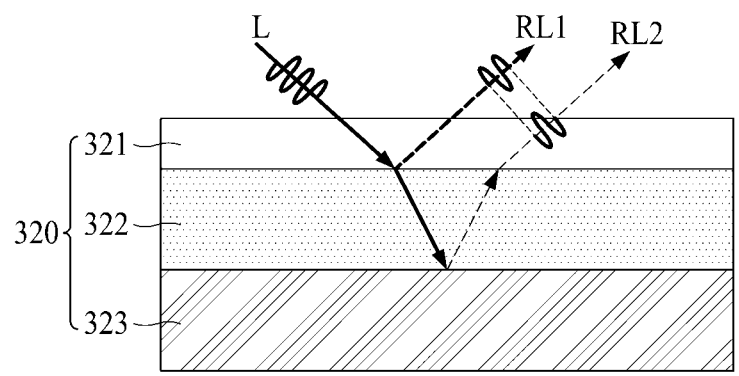
FIG. 11 is a cross-sectional view illustrating an example of an external light anti-reflection layer according to an embodiment.
Figure 12:
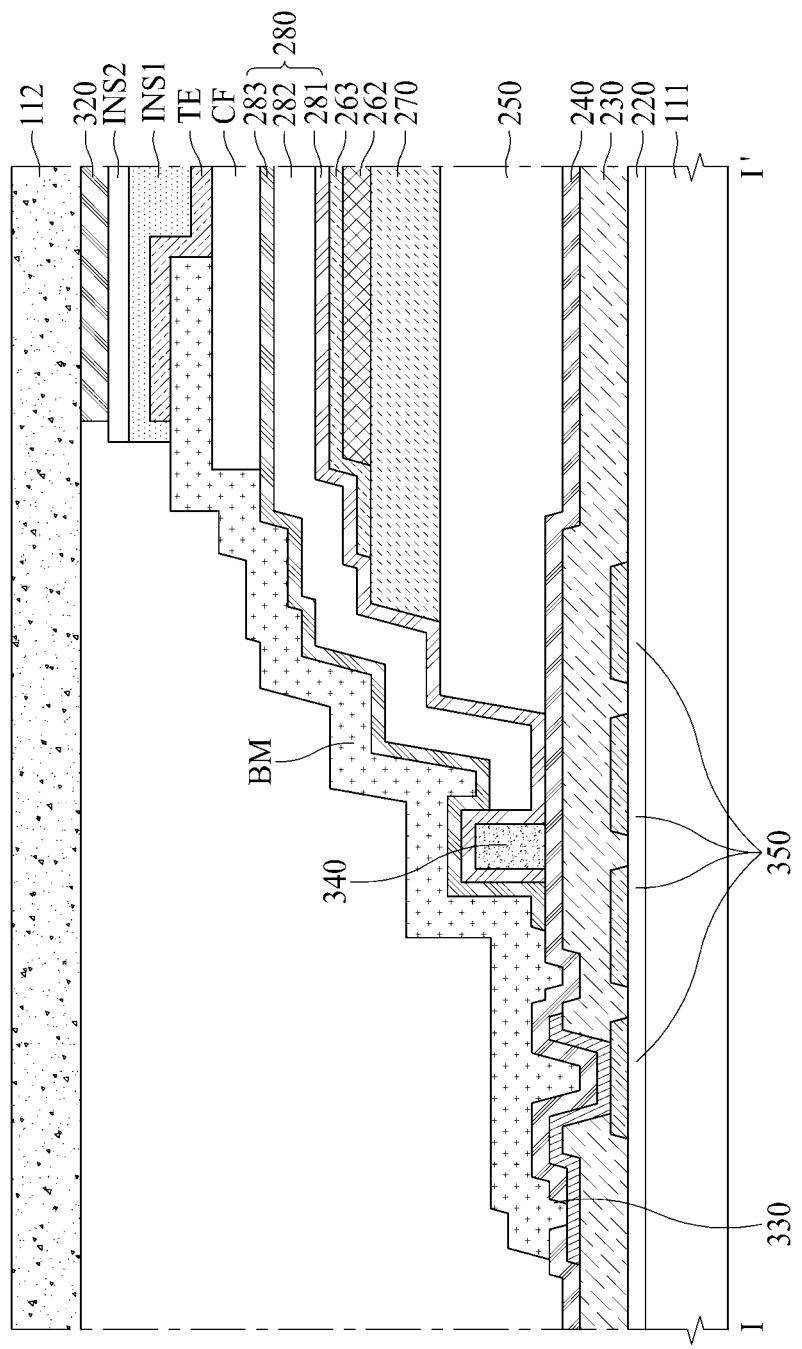
FIG. 12 is a cross-sectional view of the display device shown in FIG. 7 taken along line I-I' according to an embodiment.

FIG. 7 is an enlarged plan view of a touch sensing layer and a color filter layer of the display device with shown in FIG. 3 according to an embodiment. FIG. 8 is a cross-sectional view of the display device shown in FIG. 7 taken along line □-□' according to an embodiment. FIG. 9 is a cross-sectional view of the display device shown in FIG. 7 taken along line □-□' according to an embodiment. FIG. 10A is a cross-sectional view illustrating an example of a black matrix according to an embodiment. FIG. 10B is a cross-sectional view illustrating another example of a black matrix according to an embodiment. FIG. 11 is a cross-sectional view illustrating an example of an external light anti-reflection layer according to an embodiment. FIG. 12 is a cross-sectional view of the display device shown in FIG. 7 taken along line I-I' according to an embodiment.

Referring to FIGS. 7 to 12, a TFT layer 10 may be formed on a first substrate 111. The TFT layer 10 may include a plurality of TFTs 210, a gate insulation layer 220, an interlayer insulation layer 230, a passivation layer 240, and a planarization layer 250.

A buffer layer may be formed on one surface of the first substrate 111. The buffer layer may be formed on the one surface of the first substrate 111, for protecting the TFTs 210 and a plurality of organic light emitting devices 260 from water penetrating through the first substrate 111 vulnerable to penetration of water. The one surface of the first substrate 111 may be a surface facing the second substrate 112. The buffer layer may be formed of a plurality of inorganic layers which are alternately stacked. For example, the buffer layer may be formed of a multilayer where one or more inorganic layers of silicon oxide (SiOx), silicon nitride (SiNx), and SiON are alternately stacked. The buffer layer may be omitted in some embodiments.

The TFTs 210 may be formed on the buffer layer. The TFTs 210 may each include an active layer 211, a gate electrode 212, a source electrode 214, and a drain electrode 215. In FIG. 8, the TFTs 210 are exemplarily illustrated as being formed in a top gate type where the gate electrode 212 is disposed on the active layer 211, but is not limited thereto. That is, the TFTs 210 may be formed in a bottom gate type where the gate electrode 212 is disposed under the active layer 211 or a double gate type where the gate electrode 212 is disposed both on and under the active layer 211.

The active layer 211 may be formed on the buffer layer. The active layer 211 may be formed of a silicon-based semiconductor material, an oxide-based semiconductor material, and/or the like. A light blocking layer (not shown) for blocking external light incident on the active layer 211 may be formed between the buffer layer and the active layer 211.

The gate insulation layer 220 may be formed on the active layer 211. The gate insulation layer 220 may be formed of an inorganic layer, and for example, may be formed of silicon oxide (SiOx), silicon nitride (SiNx), or a multilayer thereof.

The gate electrode 212 and a gate line may be formed on the gate insulation layer 220. The gate electrode 212 and the gate line may each be formed of a single layer or a multilayer which includes one of molybdenum (Mo), aluminum (Al), chromium (Cr), gold (Au), titanium (Ti), nickel (Ni), neodymium (Nd), and copper (Cu), or an alloy thereof.

The interlayer insulation layer 230 may be formed on the gate electrode 212 and the gate line. The interlayer insulation layer 230 may be formed of an inorganic layer, and for example, may be formed of SiOx, SiNx, or a multilayer thereof.

The source electrode 214, the drain electrode 215, and a data line may be formed on the interlayer insulation layer 230. Each of the source electrode 214 and the drain electrode 215 may contact the active layer 211 through a contact hole which passes through the gate insulation layer 220 and the interlayer insulation layer 230. The source electrode 214, the drain electrode 215, and the data line may each be formed of a single layer or a multilayer which includes one of Mo, Al, Cr, Au, Ti, Ni, Nd, and Cu, or an alloy thereof.

The passivation layer 240 for insulating the TFT 210 may be formed on the source electrode 214, the drain electrode 215, and the data line. The passivation layer 240 may be formed of an inorganic layer, and for example, may be formed of SiOx, SiNx, or a multilayer thereof.

The planarization layer 250 for planarizing a step height caused by the TFT 210 may be formed on the passivation layer 240. The planarization layer 250 may be formed of an organic layer such as acryl resin, epoxy resin, phenolic resin, polyamide resin, polyimide resin, and/or the like.

The organic light emitting device layer 20 may be formed on the TFT layer 10. The organic light emitting device layer 20 may include the organic light emitting devices 260 and a bank 270.

The organic light emitting devices 260 and the bank 270 may be formed on the planarization layer 250. The organic light emitting devices 260 may each include a first electrode 261, an organic light emitting layer 262, and a second electrode 263. The first electrode 261 may be an anode electrode, and the second electrode 263 may be a cathode electrode.

The first electrode 261 may be formed on the planarization layer 250. The first electrode 261 may be connected to the source electrode 214 of the TFT 210 through a contact hole which passes through the passivation layer 240 and the planarization layer 250. The first electrode 261 may be formed of a metal material, which is high in reflectivity, such as a stacked structure (Ti/Al/Ti) of Al and Ti, a stacked structure (ITO/Al/ITO) of Al and ITO, an APC alloy, or a stacked structure (ITO/APC/ITO) of an APC alloy and ITO. The APC alloy may be an alloy of Ag, palladium (Pd), and Cu.

The bank 270 may be formed on the planarization layer 250 to cover an edge of the first electrode 261, for dividing a plurality of pixels, e.g., P1 to P3. That is, the bank 270 may act as a pixel defining layer that defines the pixels P1 to P3.

Each of the pixels P1 to P3 may denote an area where a first electrode corresponding to an anode electrode, an organic light emitting layer, and a second electrode corresponding to a cathode electrode are sequentially stacked, a hole from the first electrode and an electron from the second electrode are combined with each other in the organic light emitting layer to emit light. In this case, a first pixel P1 may be defined as a red subpixel, a second pixel P2 may be defined as a green subpixel, and a third pixel P3 may be defined as a blue subpixel. Also, the first to third pixels P1 to P3 may be defined as one unit pixel. However, an embodiment of the present disclosure is not limited thereto, and a white subpixel may be additionally defined.

The organic light emitting layer 262 may be formed on the first electrode 261 and the bank 270. The organic light emitting layer 262 may be a common layer which is formed in the pixels P1 to P3 in common, and may be a white light emitting layer which emits white light. In this case, the organic light emitting layer 262 may be formed in a tandem structure including two or more stacks. Each of the stacks may include a hole transporting layer, at least one light emitting layer, and an electron transporting layer.

Moreover, a charge generating layer may be formed between the stacks. The charge generating layer may include an n-type charge generating layer, disposed adjacent to a lower stack, and a p-type charge generating layer which is formed on the n-type charge generating layer and is disposed adjacent to an upper stack. The n-type charge generating layer may inject an electron into the lower stack, and the p-type charge generating layer may inject a hole into the upper stack. The n-type charge generating layer may be formed of an organic layer where alkali metal, such as lithium (Li), sodium (Na), potassium (K), or cesium (Cs), or alkali earth metal such as magnesium (Mg), strontium (Sr), barium (Ba), or radium (Ra) is doped on an organic host material having an ability to transport electrons. The p-type charge generating layer may be an organic layer where a dopant is doped on an organic material having an ability to transport holes.

The second electrode 263 may be formed on the organic light emitting layer 262. The second electrode 263 may be formed to cover the organic light emitting layer 262. The second electrode 263 may be a common layer which is formed in a plurality of pixels such as red subpixel, green subpixel, blue subpixel, and white subpixel in common.

The second electrode 263 may be formed of a transparent conductive material (or TCO), such as indium tin oxide (ITO) or indium zinc oxide (IZO) capable of transmitting light, or a semi-transmissive conductive material such as Mg, Ag, or an alloy of Mg and Ag. If the second electrode 263 is formed of a semi-transmissive conductive material, emission efficiency may be enhanced by a micro-cavity. A capping layer may be formed on the second electrode 263.

The encapsulation layer 30 may be formed on the organic light emitting device layer 20. The encapsulation layer 30 may include an encapsulation film 280.

In detail, the encapsulation film 280 may be disposed on the second electrode 263. The encapsulation film 280 prevents oxygen or water from penetrating into the organic light emitting layer 262 and the second electrode 263. To this end, the encapsulation film 280 may include at least one inorganic film and at least one organic film. For example, the encapsulation film 280 may include a first inorganic film 281, an organic film 282, and a second inorganic film 283.

The first inorganic film 281 may be disposed on the second electrode 263. The first inorganic film 281 may be formed to cover the second electrode 263. The organic film 282 may be disposed on the first inorganic film 281. The organic film 282 may be formed to a sufficient thickness for preventing particles from penetrating into the organic light emitting layer 262 and the second electrode 263 via the first inorganic film 281. The organic film 282, as illustrated in FIG. 12, may be blocked by a dam 340 so as not to cover a pad 330. The second inorganic film 283 may be disposed on the organic film 282. The second inorganic film 283 may be formed to cover the organic film 282.

Each of the first and second inorganic films 281 and 283 may be formed of silicon nitride, aluminum nitride, zirconium nitride, titanium nitride, hafnium nitride, tantalum nitride, silicon oxide, aluminum oxide, titanium oxide, and/ or the like. The organic film 282 may be formed of acryl resin, epoxy resin, phenolic resin, polyamide resin, polyimide resin, and/or the like.

A color filter layer 40 may be formed on the encapsulation layer 30. The color filter layer 40 may include first to third color filters CF1 to CF3 and a black matrix BM.

In one embodiment, the first to third color filters CF1 to CF3 having different transmissive wavelength ranges may be disposed on the encapsulation film 280. The first color filter CF1 may be a red color filter disposed in correspondence with the first pixel P1, the second color filter CF2 may be a green color filter disposed in correspondence with the second pixel P2, and the third color filter CF3 may be a blue color filter disposed in correspondence with the third pixel P3. In this case, the first color filter CF1 may be formed of an organic layer including a red pigment, the second color filter CF2 may be formed of an organic layer including a green pigment, and the third color filter CF3 may be formed of an organic layer including a blue pigment.

Although not shown, the color filter layer 40 may further include a transparent organic layer disposed in correspondence with a white subpixel. In this case, the transparent organic layer may be formed of acryl resin, epoxy resin, phenolic resin, polyamide resin, polyimide resin, and/or the like.

The black matrix BM may be formed on the color filters, e.g., the first to third color filters CF1 to CF3. The black matrix BM may be disposed in boundary portions (or disposed to overlap the boundary portions) between the color filters, e.g., the first to third color filters CF1 to CF3, for preventing color mixture which occurs when light emitted from one pixel travels to a color filter of an adjacent pixel.

The black matrix BM may include a three or more-layered metal layer. The black matrix BM according to an embodiment of the present disclosure, as illustrated in FIG. 10A, may include a first semi-transmission layer 311, a first light path changing layer 312, and a first reflection layer 313.

In some embodiments, the first semi-transmission layer 311 may be directly disposed on a top of each of the first to third color filters CF1 to CF3 to reflect some of light incident from the organic light emitting device layer 20 and transmit the other of the light. The first semi-transmission layer 311 may be formed of, for example, chromium (Cr), molybdenum (Mo), an alloy (MoTi) of Mo and Ti, tungsten (W), vanadium (V), niobium (Nb), tantalum (Ta), manganese (Mn), cobalt (Co), nickel (Ni), or the like which is high in a light absorption rate. Particularly, since the alloy (MoTi) of Mo and Ti has a high adhesive force, the alloy (MoTi) of Mo and Ti prevents the first semi-transmission layer 311 from being partially detached from the first to third color filters CF1 to CF3.

The first light path changing layer 312 may be disposed on the first semi-transmission layer 311 to change a path of light passing through the first semi-transmission layer 311. The first light path changing layer 312 may include a transparent metal material such as ITO, IZO, or the like.

The first reflection layer 313 may be disposed on the first light path changing layer 312 to reflect light of which a path has been changed by the first light path changing layer 312. The first reflection layer 313 may be formed of, for example, chromium (Cr), molybdenum (Mo), an alloy (MoTi) of Mo and Ti, tungsten (W), vanadium (V), niobium (Nb), tantalum (Ta), manganese (Mn), cobalt (Co), nickel (Ni), or other materials that have a high light absorption rate.

The first semi-transmission layer 311 and the first reflection layer 313 may be formed of the same material. In this case, in an embodiment of the present disclosure, a thickness of the first semi-transmission layer 311 may be set thinner than that of the first reflection layer 313, thereby satisfying a destructive interference condition.

To provide a more detailed description, in an embodiment of the present disclosure, the first light path changing layer 312 may be disposed between the first semi-transmission layer 311 and the first reflection layer 313, causing destructive interference caused by a light path difference. As illustrated in FIG. 10A, some of light L incident on the first semi-transmission layer 311 from the organic light emitting device layer 20 may be reflected as first reflection light RL1. Also, some of the light L may pass through the first semi-transmission layer 311, and a light path may be changed by the first light path changing layer 312. The path-changed light may be reflected as second reflection light RL2 by the first reflection layer 313. In this case, a phase of the first reflection light RL1 may be opposite to a phase of the second reflection light RL2, and thus, the first reflection light RL1 and the second reflection light RL2 are dissipated by the destructive interference. To this end, a thickness of the first light path changing layer 312 may be set in order for the first reflection light RL1 and the second reflection light RL2 to be dissipated by the destructive interference. Also, in an embodiment of the present disclosure, the first semi-transmission layer 311 may be formed thinner than the first reflection layer 313, and thus, the light L incident from the organic light emitting device layer 20 may be semi-transmitted by the first semi-transmission layer 311 and may be reflected by the first reflection layer 313.

Therefore, the black matrix BM configured with the first semi-transmission layer 311, the first light path changing layer 312, and the first reflection layer 313 may dissipate the light L incident from the organic light emitting device layer 20 by using the destructive interference, thereby preventing color mixture from occurring in the boundary portion between the first to third color filters CF1 to CF3.

The first reflection layer 313 may contact first and second touch electrodes TE and RE to be described below and may decrease resistances of the first and second touch electrodes TE and RE.

A black matrix BM according to another embodiment of the present disclosure, as illustrated in FIG. 10B, may include a first semi-transmission layer 311, a first light path changing layer 312, a first reflection layer 313, and an auxiliary metal layer 314. In comparison with the black matrix BM illustrated in FIG. 10A, the black matrix BM illustrated in FIG. 10B is characterized in that the auxiliary metal layer 314 is additionally formed.

The auxiliary metal layer 314 may be disposed on the first reflection layer 313 to reflect light passing through the first reflection layer 313. The auxiliary metal layer 314 may be formed of Al, thereby enhancing a resistance reduction effect of the first and second touch electrodes TE and RE rather than the first reflection layer 313.

The touch sensing layer 50 may be formed on the color filter layer 40. The touch sensing layer 50 may include a plurality of first touch electrodes TE, a plurality of second touch electrodes RE, a first insulation layer INS1, and a plurality of bridge electrodes BE. In an embodiment, the touch sensing layer 50 may further include at least one of a second insulation layer INS2, an anti-reflection pattern 320, and a third insulation layer INS3.

In some embodiments, the first touch electrodes TE and the second touch electrodes RE may be directly formed on a top of the color filter layer 40. The first touch electrodes TE and the second touch electrodes RE may be formed of a transparent metal material such as ITO, IZO, or the like. In this case, since ITO and IZO have high resistance, the first touch electrodes TE and the second touch electrodes RE cause an RC delay time affected by a resistor (R) and a capacitor (C). To this end, in an embodiment of the present disclosure, the first touch electrodes TE and the second touch electrodes RE may be formed to contact the black matrix BM formed of a three or more-layered metal layer, thereby decreasing a resistance and preventing occurrence of the RC delay time.

The first touch electrodes TE, the second touch electrodes RE, the first touch lines TL, and the second touch lines RL may be disposed on the same layer. The first insulation layer INS1 may be disposed to cover the first touch electrodes TE, the second touch electrodes RE, the first touch lines TL, and the second touch lines RL. In this case, the first insulation layer INS1 may be disposed between each of the first touch electrodes TE and each of the second touch electrodes RE. Each of the first touch electrodes TE may be insulated from each of the second touch electrodes RE by the first insulation layer INS1. Also, the first insulation layer INS1 may be disposed on the first touch electrodes TE and the second touch electrodes RE. The second touch electrodes RE may be insulated from the bridge electrodes BE by the first insulation layer INS1.

The first touch line TL may extend from the first touch electrode TE, or as illustrated in FIG. 12, the first touch line TL may extend from the black matrix BM contacting the first touch electrode TE. The second touch line RL may extend from the second touch electrode RE, or similar as the first touch line TL, the second touch line RL may extend from the black matrix BM contacting the second touch electrode RE. Each of the first and second touch lines TL and RL may extend to a non-display area and may contact the pad 330. Each of the first touch line TL and the second touch line RL may be connected with a pad through a contact hole exposing the passivation layer. The black matrix BM may extend from each of the first touch electrode TE and the second touch electrode. RE. The black matrix BM may be connected with a pad through a contact hole exposing the passivation layer.

The bridge electrodes BE may be connected to the first touch electrodes TE adjacent to each other through a plurality of contact portions CT, respectively. The bridge electrode BE may intersect (e.g., vertically overlap but not physically touch) the second touch electrode RE. In this case, the contact portions CT may be formed to pass through the first insulation layer INS1.

The bridge electrodes BE may be formed of a transparent metal material such ITO or IZO like the first touch electrodes TE and the second touch electrodes RE, but are not limited thereto. The bridge electrodes BE may be disposed to overlap the black matrix BM with the first touch electrode TE and the second touch electrode RE therebetween. In this case, the bridge electrodes BE may be formed in a non-emission part, and thus, may be formed of an opaque metal material or a semi-transparent metal material having conductivity.

The anti-reflection pattern 320 may be disposed on the bridge electrodes BE to correspond to (e.g., overlap) the black matrix BM, thereby preventing reflection of light incident from the outside. If the bridge electrodes BE or the black matrix BM include(s) the auxiliary metal layer 314, the light incident from the outside may be reflected by the auxiliary metal layer 314. The anti-reflection pattern 320 prevents reflection of the external light.

The anti-reflection pattern 320 may include a three or more-layered metal layer. The anti-reflection pattern 320 according to an embodiment of the present disclosure, as illustrated in FIG. 11, may include a second semi-transmission layer 321, a second light path changing layer 322, and a second reflection layer 323.

The second semi-transmission layer 321 may be disposed under the second substrate 112 to reflect some of light L incident from the outside and transmit the other of the light L. The second semi-transmission layer 321 may be formed of, for example, chromium (Cr), molybdenum (Mo), an alloy (MoTi) of Mo and Ti, tungsten (W), vanadium (V), niobium (Nb), tantalum (Ta), manganese (Mn), cobalt (Co), nickel (Ni), or other materials that have a high light absorption rate.

The second light path changing layer 322 may be disposed under the second semi-transmission layer 321 to change a path of light passing through the second semi-transmission layer 321. The second light path changing layer 322 may include a transparent metal material such as ITO, IZO, or the like.

The second reflection layer 323 may be disposed under the second light path changing layer 322 to reflect light of which a path has been changed by the second light path changing layer 322. The second reflection layer 323 may be formed of, for example, chromium (Cr), molybdenum (Mo), an alloy (MoTi) of Mo and Ti, tungsten (W), vanadium (V), niobium (Nb), tantalum (Ta), manganese (Mn), cobalt (Co), nickel (Ni), or other materials that have a high light absorption rate.

The second semi-transmission layer 321 and the second reflection layer 323 may be formed of the same material. In this case, in an embodiment of the present disclosure, a thickness of the second semi-transmission layer 321 may be set thinner than that of the second reflection layer 323, thereby satisfying a destructive interference condition.

To provide a more detailed description, in an embodiment of the present disclosure, the second light path changing layer 322 may be disposed between the second semi-transmission layer 321 and the second reflection layer 323, causing destructive interference caused by a light path difference. As illustrated in FIG. 11, some of light L incident on the second semi-transmission layer 321 from the outside may be reflected as first reflection light RL1. Also, some of the light L may pass through the second semi-transmission layer 321, and a light path may be changed by the second light path changing layer 322. The path-changed light may be reflected as second reflection light RL2 by the second reflection layer 323. In this case, a phase of the first reflection light RL1 may be opposite to a phase of the second reflection light RL2, and thus, the first reflection light RL1 and the second reflection light RL2 are dissipated by the destructive interference. To this end, a thickness of the second light path changing layer 322 may be set in order for the first reflection light RL1 and the second reflection light RL2 to be dissipated by the destructive interference. Also, in an embodiment of the present disclosure, the second semi-transmission layer 321 may be formed thinner than the second reflection layer 323, and thus, the light L incident from the outside may be semi-transmitted by the second semi-transmission layer 321 and may be reflected by the second reflection layer 323.

The anti-reflection pattern 320 configured with the second semi-transmission layer 321, the second light path changing layer 322, and the second reflection layer 323 may dissipate the light L incident from the outside by using the destructive interference, thereby reducing an external light reflection rate. Accordingly, according to an embodiment of the present disclosure, even without a polarizer, image visibility of the display device is prevented from being reduced, and image quality is enhanced.

The second insulation layer INS2 may be disposed to cover the bridge electrodes BE. In this case, the second insulation layer INS2 may be disposed between the bridge electrodes BE. The bridge electrodes BE may be insulated from each other by the second insulation layer INS2. Also, the second insulation layer INS2 may be disposed on the bridge electrodes BE. The bridge electrodes BE may be insulated from the anti-reflection pattern 320 by the second insulation layer INS2. In FIGS. 8 and 9, the second insulation layer INS2 is illustrated as being formed between the anti-reflection pattern 320 and the bridge electrodes BE, but it not limited thereto. In other embodiments, the second insulation layer INS2 may be omitted.

The third insulation layer INS3 may be formed on the same layer as the anti-reflection pattern 320 which is provided in plurality. In this case, the third insulation layer INS3 may be disposed between the anti-reflection patterns 320. The anti-reflection patterns 320 may be insulated from each other by the third insulation layer INS3. In FIG. 8, the third insulation layer INS3 is illustrated as being formed between the anti-reflection patterns 320, but it not limited thereto. In other embodiments, the third insulation layer INS3 may be omitted.

The anti-reflection patterns 320 of the first substrate 111 may be adhered to the second substrate 112 by using an adhesive layer (not shown), thereby bonding the first substrate 111 to the second substrate 112. The adhesive layer (not shown) may be an optically clear resin (OCR) or an optically clear adhesive film (OCA).

According to an embodiment of the present disclosure, since the color filter layer 40 may be directly formed on the encapsulation layer 30 and the touch sensing layer 50 may be directly formed on the color filter layer 40, alignment is not needed in bonding the first substrate 111 to the second substrate 112, and a separate adhesive layer is not needed.

Moreover, according to an embodiment of the present disclosure, since an adhesive layer is not formed between the encapsulation layer 30 and the color filter layer 40, a distance between the organic light emitting layer of the organic light emitting device layer 20 and the black matrix BM of the color filter layer 40 is reduced, and thus, color mixture does not occur and a luminance viewing angle and a color viewing angle are improved.

Moreover, according to an embodiment of the present disclosure, by using the three or more-layered metal layer formed between the color filters and the touch electrode, the color mixture of light emitted from the organic light emitting device layer 20 is prevented, and moreover, a resistance of the touch electrode is reduced.

Moreover, according to an embodiment of the present disclosure, an external light reflection rate is reduced by using the three or more-layered metal layer formed on the touch electrodes. Accordingly, according to an embodiment of the present disclosure, reflection of external light is prevented without a polarizer, and image visibility is enhanced.

Figure 13:
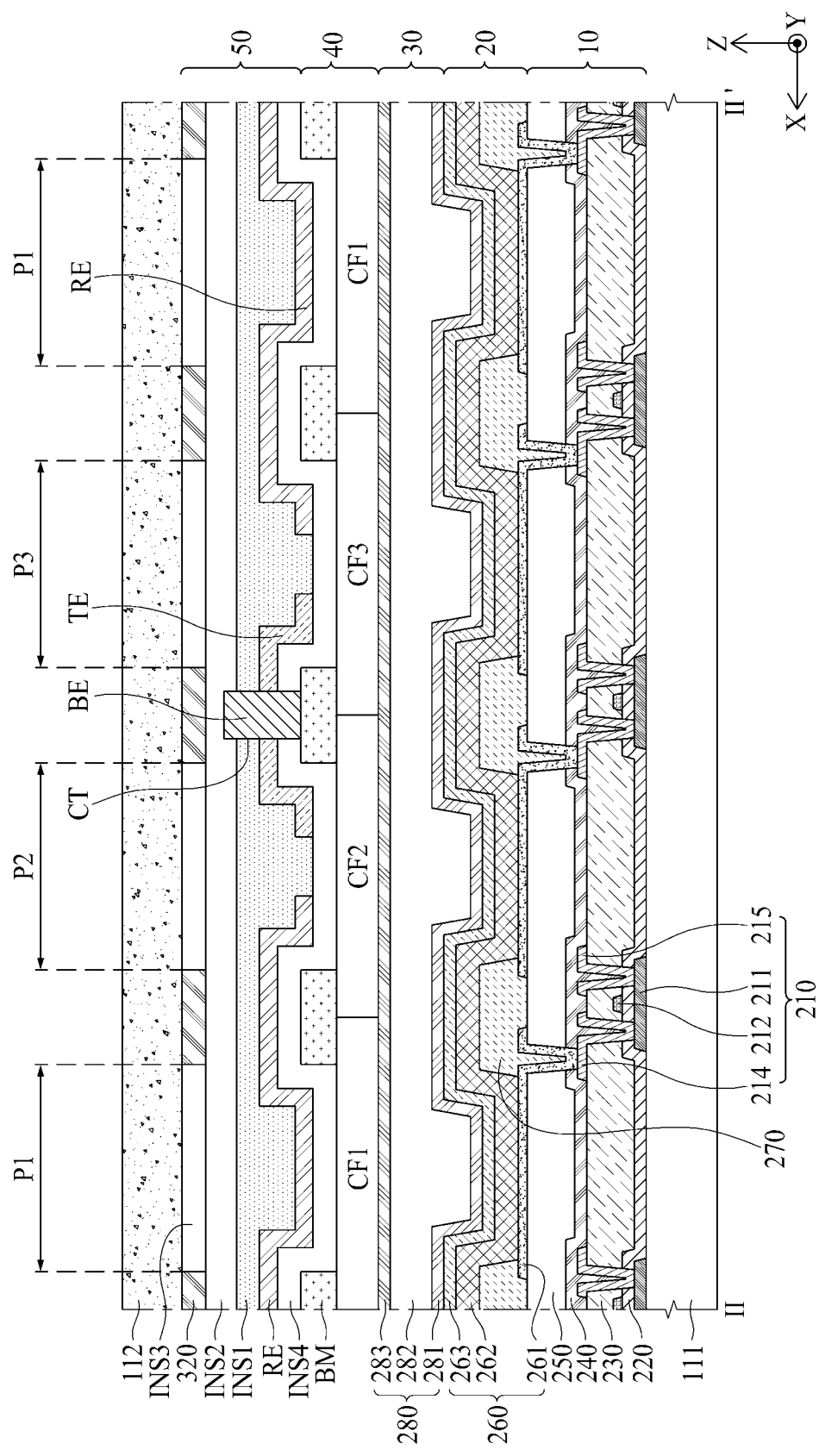
FIG. 13 is a cross-sectional view of the display device shown in FIG. 7 taken along line □-□' according to an embodiment.
Figure 14:
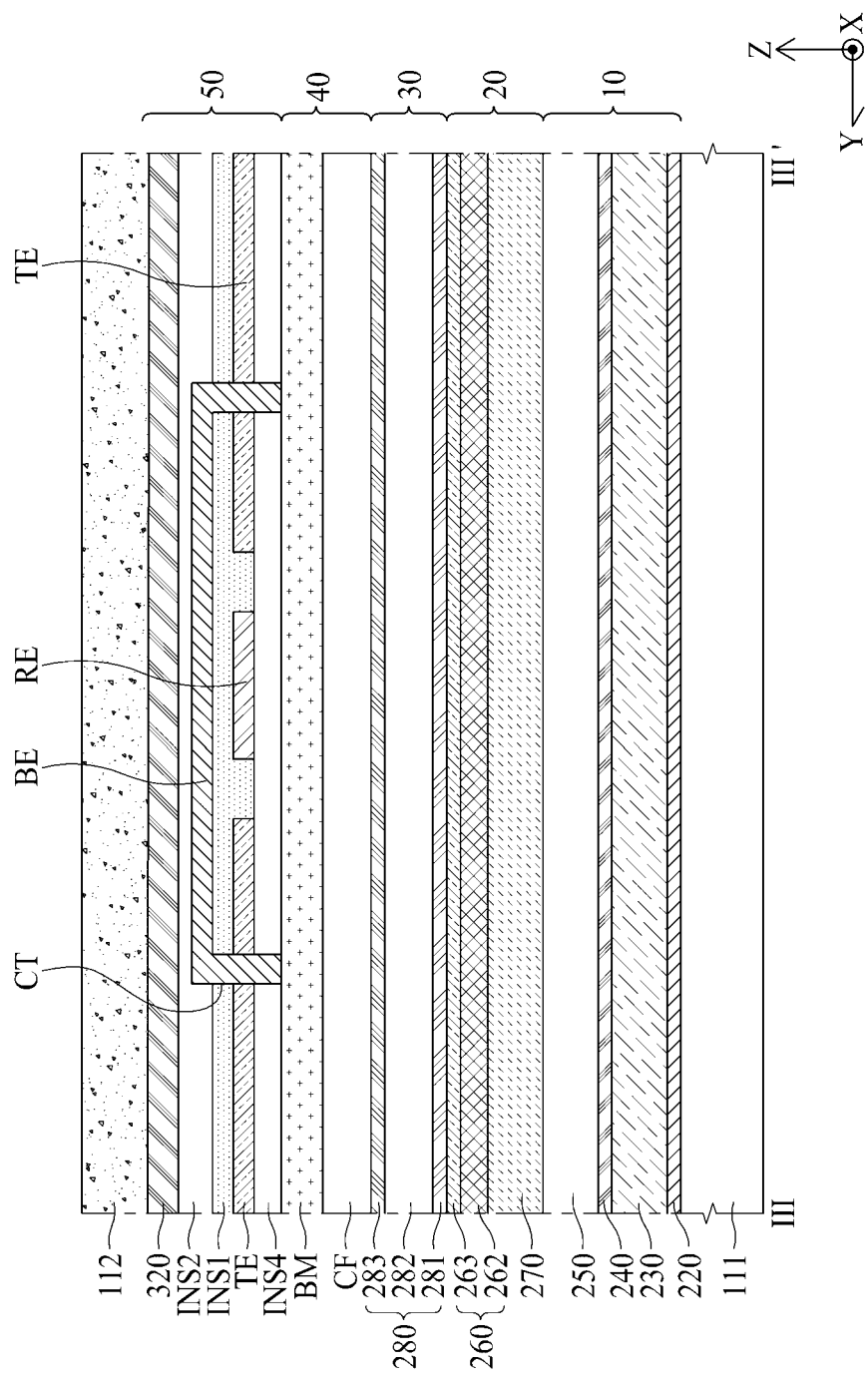
FIG. 14 is a cross-sectional view of the display device shown in FIG. 7 taken along line □-□' according to an embodiment.

FIG. 13 is a cross-sectional view of the display device shown in FIG. 7 taken along line □-□' according to an embodiment. FIG. 14 is a cross-sectional view of the display device shown in FIG. 7 taken along line □-□' according to an embodiment.

Except that a fourth insulation layer INS4 is formed between a black matrix BM and first and second touch electrodes TE and RE, the cross-sectional views of FIGS. 13 and 14 are substantially the same as the details described above with reference to FIGS. 8 and 9. Therefore, detailed descriptions on the first substrate 111, the second substrate 112, the TFT layer 10, the organic light emitting device layer 20, the encapsulation layer 30, and the color filter layer 40 illustrated in FIGS. 8 and 9 are omitted.

A touch sensing layer 50 may be formed on a color filter layer 40. The touch sensing layer 50 may include a plurality of first touch electrodes TE, a plurality of second touch electrodes RE, a first insulation layer INS1, a plurality of bridge electrodes BE, and a fourth insulation layer INS4.

In some embodiments, the fourth insulation layer INS4 may be directly formed on a top of the color filter layer 40. The fourth insulation layer INS4 may be disposed to cover first to third color filters CF1 to CF3 and a black matrix BM. In some embodiments, the fourth insulation layer INS4 may be disposed between the black matrix BM and first and second touch electrodes TE and RE to prevent the first and second touch electrodes TE and RE from being partially detached from the black matrix BM.

The first touch electrodes TE and the second touch electrodes RE may be formed on the fourth insulation layer INS4. The first touch electrodes TE and the second touch electrodes RE may be formed of a transparent metal material such as ITO, IZO, or the like.

The first insulation layer INS1 may be disposed to cover the first touch electrodes TE, the second touch electrodes RE, first touch lines TL, and second touch lines RL. In some embodiments, the first insulation layer INS1 may be disposed between each of the first touch electrodes TE and each of the second touch electrodes RE. Each of the first touch electrodes TE may be insulated from each of the second touch electrodes RE by the first insulation layer INS1. Also, the first insulation layer INS1 may be disposed on the first touch electrodes TE and the second touch electrodes RE. The second touch electrodes RE may be insulated from the bridge electrodes BE by the first insulation layer INS1.

The bridge electrodes BE may be connected to, through a plurality of contact portions CT, the first touch electrodes TE adjacent to each other and the black matrix BM disposed under the first touch electrodes TE. The bridge electrode BE may intersect (e.g., vertically overlap but not physically touch) the second touch electrode RE. In this case, the contact portions CT may be formed to pass through the first insulation layer INS1, the first touch electrode TE, and the fourth insulation layer INS4.

The bridge electrodes BE may be formed of a transparent metal material such ITO or IZO like the first touch electrodes TE and the second touch electrodes RE, but are not limited thereto. The bridge electrodes BE may be disposed to overlap the black matrix BM with the first touch electrode TE and the second touch electrode RE therebetween. In this case, the bridge electrodes BE may be formed in a non-emission part, and thus, may be formed of an opaque metal material or a semi-transparent metal material having conductivity.

Figure 15:
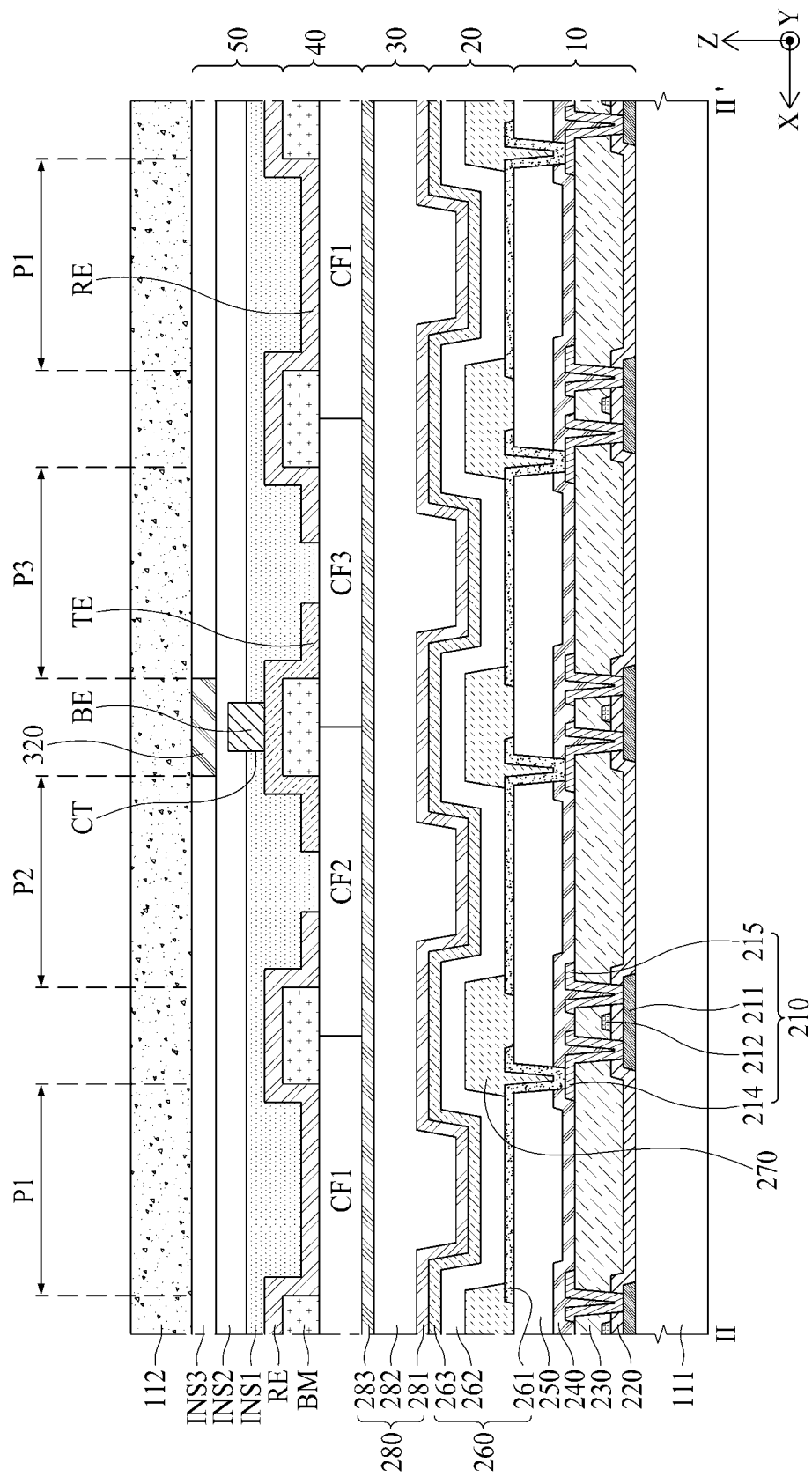
FIG. 15 is a cross-sectional view of the display device shown in FIG. 7 taken along line □-□' according to an embodiment.
Figure 16:
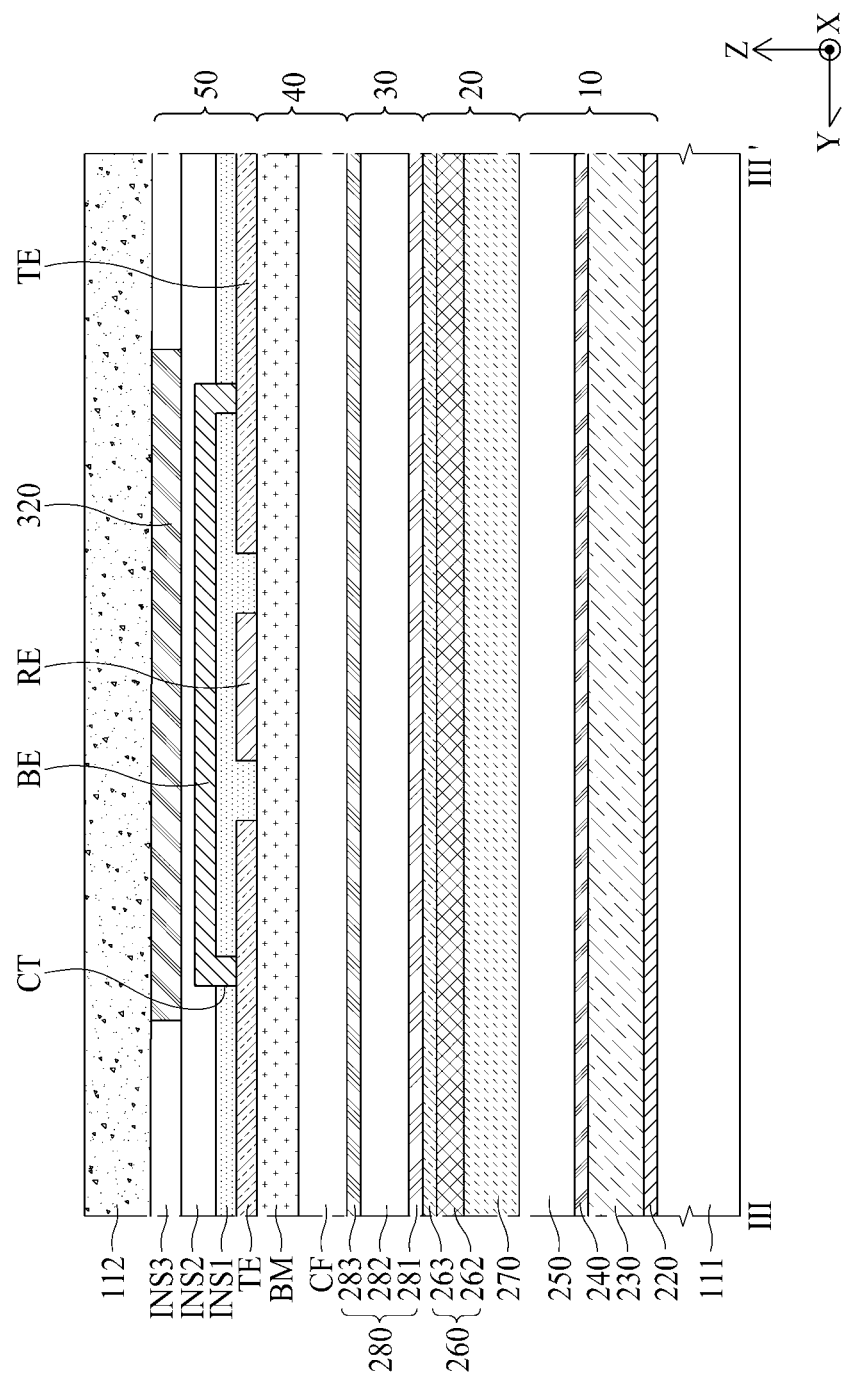
FIG. 16 is a cross-sectional view of the display device shown in FIG. 7 taken along line □-□' according to an embodiment.

FIG. 15 is a cross-sectional view of the display device shown in FIG. 7 taken along line □-□' according to an embodiment. FIG. 16 is a cross-sectional view of the display device shown in FIG. 7 taken along line □-□' according to an embodiment.

Except that an anti-reflection pattern 320 is disposed in only an area where a bridge electrode BE is formed, the cross-sectional views of FIGS. 15 and 16 are substantially the same as the details described above with reference to FIGS. 8 and 9. Therefore, detailed descriptions on the first substrate 111, the second substrate 112, the TFT layer 10, the organic light emitting device layer 20, the encapsulation layer 30, and the color filter layer 40 illustrated in FIGS. 8 and 9 are omitted.

A touch sensing layer 50 may be formed on a color filter layer 40. The touch sensing layer 50 may include a plurality of first touch electrodes TE, a plurality of second touch electrodes RE, a first insulation layer INS1, a plurality of bridge electrodes BE, a second insulation layer INS2, an anti-reflection pattern 320, and a third insulation layer INS3.

The first touch electrodes TE and the second touch electrodes RE may be formed on the color filter layer 40. The first touch electrodes TE and the second touch electrodes RE may be formed of a transparent metal material such as ITO, IZO, or the like.

The first insulation layer INS1 may be disposed to cover the first touch electrodes TE, the second touch electrodes RE, first touch lines TL, and second touch lines RL. In some embodiments, the first insulation layer INS1 may be disposed between each of the first touch electrodes TE and each of the second touch electrodes RE. Each of the first touch electrodes TE may be insulated from each of the second touch electrodes RE by the first insulation layer INS1. Also, the first insulation layer INS1 may be disposed on the first touch electrodes TE and the second touch electrodes RE. The second touch electrodes RE may be insulated from the bridge electrodes BE by the first insulation layer INS1.

The bridge electrodes BE may be connected to the first touch electrodes TE adjacent to each other through a plurality of contact portions CT. The bridge electrode BE may intersect (e.g., vertically overlap but not physically touch) the second touch electrode RE. In this case, the contact portions CT may be formed to pass through the first insulation layer INS1.

The bridge electrodes BE may be formed of a transparent metal material such ITO or IZO like the first touch electrodes TE and the second touch electrodes RE, but are not limited thereto. The bridge electrodes BE may be disposed to overlap the black matrix BM with the first touch electrode TE and the second touch electrode RE therebetween. In this case, the bridge electrodes BE may be formed in a non-emission part, and thus, may be formed of an opaque metal material or a semi-transparent metal material having conductivity.

The anti-reflection pattern 320 may be disposed on, e.g., to vertically overlap with, the bridge electrodes BE to prevent reflection of light incident from the outside. The light incident from the outside may be reflected by the bridge electrodes BE.

In an embodiment of the present disclosure, the anti-reflection pattern 320 may be disposed to correspond to (e.g., overlap) an area where the black matrix BM is formed. If the black matrix BM includes an auxiliary metal layer 314, the light incident from the outside may be reflected by the auxiliary metal layer 314, and thus, the anti-reflection pattern 320 may be disposed to correspond to the area where the black matrix BM is formed.

On the other hand, if the black matrix BM does not include the auxiliary metal layer 314, the anti-reflection pattern 320 may not be disposed over a whole portion of the area where the black matrix BM is formed. In some embodiments, the anti-reflection pattern 320 may be disposed only to overlap areas where the bridge electrodes BE are formed. Accordingly, a width where the anti-reflection pattern 320 is formed is reduced, and the manufacturing cost of the display panel is reduced.

Figure 17:
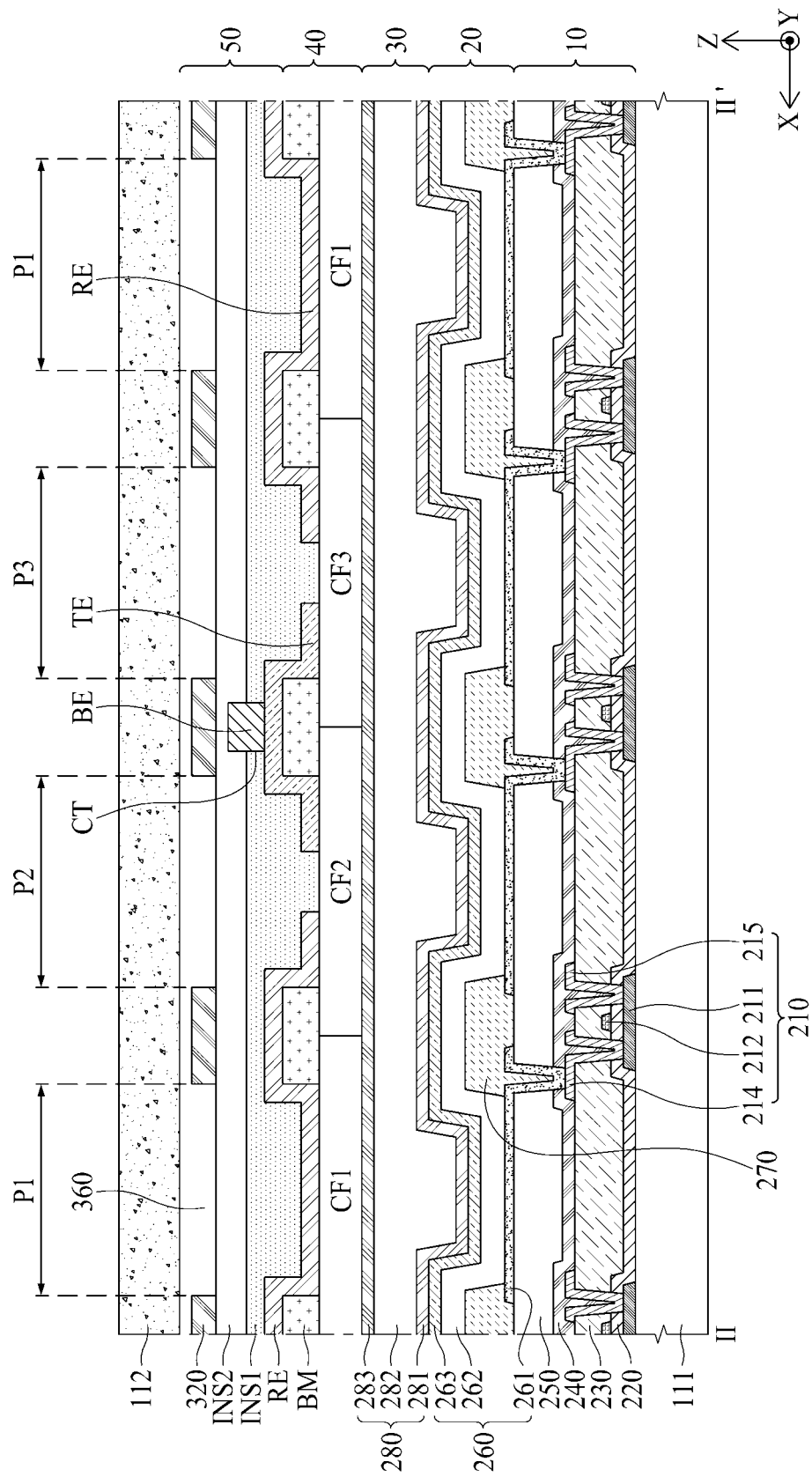
FIG. 17 is a cross-sectional view of the display device shown in FIG. 7 taken along line □-□' according to an embodiment.
Figure 18:
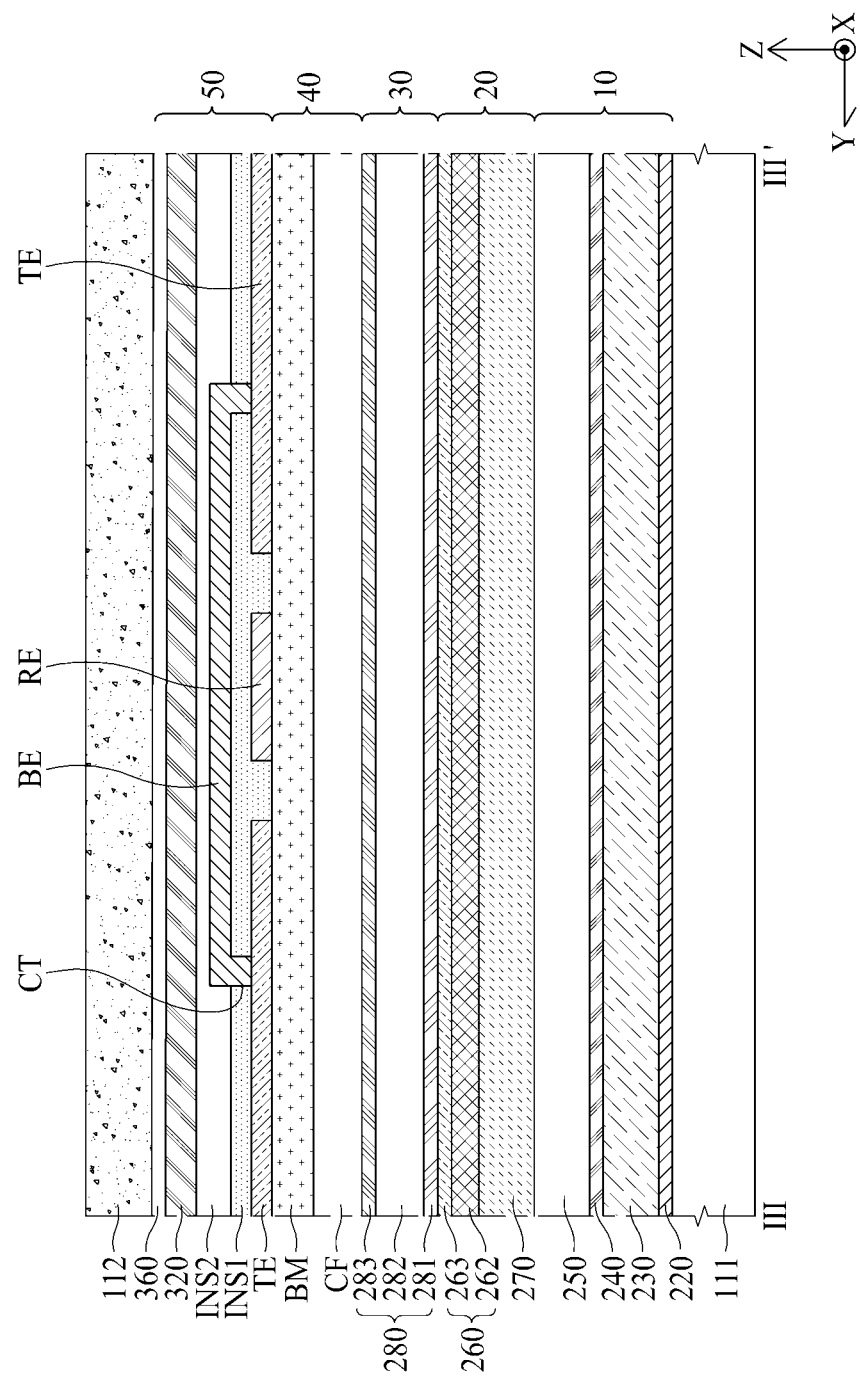
FIG. 18 is a cross-sectional view of the display device shown in FIG. 7 taken along line □-□' according to an embodiment.

FIG. 17 is a cross-sectional view of the display device shown in FIG. 7 taken along line □-□' according to an embodiment. FIG. 18 is a cross-sectional view of the display device shown in FIG. 7 taken along line □-□' according to an embodiment.

Except that a reflection reducing layer 360 is formed to cover an anti-reflection pattern 320, the cross-sectional views of FIGS. 17 and 18 are substantially the same as the details described above with reference to FIGS. 8 and 9. Therefore, detailed descriptions on the first substrate 111, the second substrate 112, the TFT layer 10, the organic light emitting device layer 20, the encapsulation layer 30, and the color filter layer 40 illustrated in FIGS. 8 and 9 are omitted.

A touch sensing layer 50 may be formed on a color filter layer 40. The touch sensing layer 50 may include a plurality of first touch electrodes TE, a plurality of second touch electrodes RE, a first insulation layer INS1, a bridge electrode BE, a second insulation layer INS2, an anti-reflection pattern 320, and a reflection reducing layer 360.

The first touch electrodes TE and the second touch electrodes RE may be formed on a top of the color filter layer 40. The first touch electrodes TE and the second touch electrodes RE may be formed of a transparent metal material such as ITO, IZO, or the like.

The first insulation layer INS1 may be disposed to cover the first touch electrodes TE, the second touch electrodes RE, first touch lines TL, and second touch lines RL. In some embodiments, the first insulation layer INS1 may be disposed between each of the first touch electrodes TE and each of the second touch electrodes RE. Each of the first touch electrodes TE may be insulated from each of the second touch electrodes RE by the first insulation layer INS1. Also, the first insulation layer INS1 may be disposed on the first touch electrodes TE and the second touch electrodes RE. The second touch electrodes RE may be insulated from the bridge electrodes BE by the first insulation layer INS1.

The bridge electrodes BE may be connected to the first touch electrodes TE adjacent to each other through a plurality of contact portions CT. The bridge electrode BE may intersect (e.g., vertically overlap but not physically touch) the second touch electrode RE. In this case, the contact portions CT may be formed to pass through the first insulation layer INS1.

The bridge electrodes BE may be formed of a transparent metal material such ITO or IZO like the first touch electrodes TE and the second touch electrodes RE, but are not limited thereto. The bridge electrodes BE may be disposed to overlap the black matrix BM with the first touch electrode TE and the second touch electrode RE therebetween. In this case, the bridge electrodes BE may be formed in a non-emission part, and thus, may be formed of an opaque metal material or a semi-transparent metal material having conductivity.

The anti-reflection pattern 320 may be disposed on the bridge electrodes BE to correspond to the black matrix BM, thereby preventing reflection of light incident from the outside. If the bridge electrodes BE or the black matrix BM include(s) an auxiliary metal layer 314, the light incident from the outside may be reflected by the auxiliary metal layer 314. The anti-reflection pattern 320 prevents reflection of the external light.

The anti-reflection pattern 320 may include a three or more-layered metal layer. The anti-reflection pattern 320 may include a second semi-transmission layer 321, a second light path changing layer 322, and a second reflection layer 323. The anti-reflection pattern 320 configured with the second semi-transmission layer 321, the second light path changing layer 322, and the second reflection layer 323 may dissipate light L incident from the outside by using destructive interference, thereby reducing an external light reflection rate. Accordingly, according to an embodiment of the present disclosure, even without a polarizer, image visibility is prevented from being reduced, and image quality is enhanced.

The reflection reducing layer 360 may be disposed to cover the anti-reflection pattern 320. If the bridge electrodes BE or the black matrix BM include(s) the auxiliary metal layer 314, in order to reduce reflection of external light by the auxiliary metal layer 314, the reflection reducing layer 360 may block some of the external light. To this end, the reflection reducing layer 360 may be formed of an organic layer including a carbon-based black pigment in an embodiment.

As a transmittance of the reflection reducing layer 360 decreases, an average reflection rate of the display panel 110 also decreases. The transmittance of the reflection reducing layer 360 may be inversely proportional to a thickness of the reflection reducing layer 360. That is, as a thickness of the reflection reducing layer 360 increases, the transmittance of the reflection reducing layer 360 may decrease.

However, when the transmittance of the reflection reducing layer 360 is lowered, an emission efficiency of an organic light emitting device layer 20 is reduced. Accordingly, in some embodiments, the transmittance of the reflection reducing layer 360 is based on the emission efficiency of the organic light emitting device layer 20 as well as the average reflection rate of the display panel 110.

In an embodiment of the present disclosure, the reflection reducing layer 360 may be additionally provided, thereby more efficiently blocking reflection of external light.

In FIGS. 17 and 18, the reflection reducing layer 360 is illustrated as covering the anti-reflection patterns 320, but is not limited thereto. In other embodiments, the reflection reducing layer 360 may cover the bridge electrodes BE. In this case, the anti-reflection patterns 320 and the second insulation layer INS2 may be omitted in some embodiments.

According to some embodiments of the present disclosure, since the color filter layer may be directly formed on the encapsulation layer and the touch sensing layer may be directly formed on the color filter layer, alignment is not needed in bonding the first substrate to the second substrate, and a separate adhesive layer is not needed. Accordingly, a thickness of the display panel is reduced.

Moreover, according to some embodiments of the present disclosure, since an adhesive layer is not formed between the encapsulation layer and the color filter layer, a distance between the organic light emitting layer of the organic light emitting device layer and the black matrix of the color filter layer is reduced, and thus, color mixture does not occur and a luminance viewing angle and a color viewing angle of the display panel are improved.

Moreover, according to some embodiments of the present disclosure, by using the three or more-layered metal layer formed between the color filters and the touch electrode, the color mixture of light emitted from the organic light emitting device layer is prevented, and moreover, a resistance of the touch electrode is reduced.

Moreover, according to some embodiments of the present disclosure, the resistance of the touch electrode is reduced by using the black matrix even without forming a separate touch auxiliary electrode, the manufacturing cost of the display panel is reduced, and moreover, a thickness of the display panel is minimized.

Moreover, according to some embodiments of the present disclosure, an external light reflection rate of the display panel is reduced by using the three or more-layered metal layer formed on the touch electrodes. Accordingly, according to embodiments of the present disclosure, a contrast ratio of the display panel is enhanced without a polarizer.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A display device with integrated touch screen, the display device comprising:
   an organic light emitting device layer on a substrate;
   an encapsulation layer on the organic light emitting device layer;
   a plurality of color filters on the encapsulation layer;
   a black matrix overlapping a boundary portion between the plurality of color filters, the black matrix including three or more layers, wherein each of the three or more layers includes a metal material; and
   a plurality of first touch electrodes and a plurality of second touch electrodes on the black matrix.

2. The display device of claim 1, wherein the black matrix comprises:
   a first semi-transmission layer transmitting light incident from the organic light emitting device layer;

a first light path changing layer on the first semi-transmission layer, the first light path changing layer changing a path of the light transmitted through the first semi-transmission layer; and a first reflection layer on the first light path changing layer, the first reflection layer reflecting the light having the path changed by the first light path changing layer.

3. The display device of claim 2, wherein the first semi-transmission layer and the first reflection layer each comprises a same material.

4. The display device of claim 2, wherein a first thickness of the first semi-transmission layer is less than a second thickness of the first reflection layer.

5. The display device of claim 2, wherein the first light path changing layer comprises indium tin oxide (ITO) or indium zinc oxide (IZO).

6. The display device of claim 2, wherein the first semi-transmission layer and the first reflection layer each comprises one of chromium (Cr), molybdenum (Mo), an alloy (MoTi) of Mo and Ti, tungsten (W), vanadium (V), niobium (Nb), tantalum (Ta), manganese (Mn), cobalt (Co), and nickel (Ni).

7. The display device of claim 2, further comprising an auxiliary metal layer on the first reflection layer.

8. The display device of claim 7, wherein the auxiliary metal layer comprises aluminum (Al).

9. The display device of claim 2, wherein the first semi-transmission layer is disposed on top of each of the plurality of color filters to reflect other light incident from the organic light emitting device layer.

10. The display device of claim 2, wherein the first reflection layer contacts the plurality of first touch electrodes and the plurality of second touch electrodes.

11. The display device of claim 1, further comprising: a plurality of anti-reflection patterns on the plurality of first touch electrodes and the plurality of second touch electrodes, the plurality of anti-reflection patterns each including three or more layers each including a metal material.

12. The display device of claim 11, further comprising an insulation layer disposed on a same layer as the plurality of anti-reflection patterns, wherein the insulation layer is disposed between the plurality of anti-reflection patterns.

13. The display device of claim 11, wherein the plurality of anti-reflection patterns each comprises:
a second semi-transmission layer transmitting light incident from outside the display device;
a second light path changing layer under the second semi-transmission layer, the second light path changing layer changing a path of the light transmitted through the second semi-transmission layer; and
a second reflection layer under the second light path changing layer, the second reflection layer reflecting the light having the path changed by the second light path changing layer.

14. The display device of claim 13, wherein the second semi-transmission layer and the second reflection layer each comprises a same material.

15. The display device of claim 13, wherein a first thickness of the second semi-transmission layer is less than a second thickness of the second reflection layer.

16. The display device of claim 13, wherein the second light path changing layer comprises indium tin oxide (ITO) or indium zinc oxide (IZO).

17. The display device of claim 13, wherein the second semi-transmission layer and the second reflection layer each comprises one of chromium (Cr), molybdenum (Mo), an alloy (MoTi) of Mo and Ti, tungsten (W), vanadium (V), niobium (Nb), tantalum (Ta), manganese (Mn), cobalt (Co), and nickel (Ni).

18. The display device of claim 11, wherein the plurality of anti-reflection patterns are disposed to overlap at least a portion of the black matrix.

19. The display device of claim 11, further comprising bridge electrodes disposed on a first layer different from a second layer on which the plurality of first touch electrodes and the plurality of second touch electrodes are disposed, the bridge electrodes connecting adjacent touch electrodes of the plurality of first touch electrodes via contact portions, wherein the plurality of anti-reflection patterns are disposed to overlap the bridge electrodes.

20. The display device of claim 11, further comprising an auxiliary metal layer disposed on the first reflection layer, wherein the plurality of anti-reflection patterns are disposed to overlap with the black matrix.

21. The display device of claim 11, further comprising a reflection reducing layer disposed on the plurality of anti-reflection patterns, the reflection reducing layer blocking at least some light incident from outside the display device.

22. The display device of claim 1, further comprising:
a first insulation layer on the black matrix;
a second insulation layer on the plurality of first touch electrodes and the plurality of second touch electrodes; and
a plurality of bridge electrodes on the second insulation layer, the plurality of bridge electrodes electrically connecting the plurality of first touch electrodes,
wherein the plurality of bridge electrodes are connected to the plurality of first touch electrodes and the black matrix through a contact portion passing through the first insulation layer, the plurality of first touch electrodes, and the second insulation layer.

23. The display device of claim 1, further comprising: a reflection reducing layer on the plurality of first touch electrodes and the plurality of second touch electrodes, the reflection reducing layer blocking at least some light incident from outside the display device.

24. The display device of claim 23, wherein the reflection reducing layer comprises an organic layer including a black pigment.

25. The display device of claim 1, further comprising an insulation layer disposed on the plurality of color filters and the black matrix and disposed between the black matrix and the plurality of first touch electrodes and the plurality of second touch electrodes, wherein the plurality of first touch electrodes and the plurality of second touch electrodes are disposed on the insulation layer.

26. The display device of claim 1, wherein the plurality of first touch electrodes and the plurality of second touch electrodes are disposed on top of the color filters.

27. The display device of claim 1, further comprising an insulation layer disposed between each of the plurality of first touch electrodes and each of the plurality of second touch electrodes, and disposed on the plurality of first touch electrodes and the plurality of second touch electrodes.

28. The display device of claim 27, further comprising bridge electrodes disposed on a first layer different from a second layer on which the plurality of first touch electrodes and the plurality of second touch electrodes are disposed, the bridge electrodes connecting adjacent touch electrodes of the plurality of first touch electrodes via contact portions, wherein the bridge electrodes overlap a portion of the plurality of second touch electrodes.

29. The display device of claim 28, wherein the bridge electrodes are disposed to overlap the black matrix.

30. The display device of claim 1, further comprising a first touch line connected with the plurality of first touch electrodes and a second touch line connected with the plurality of second touch electrodes, wherein the first touch line extends from the plurality of first touch electrodes, and wherein the second touch line extends from the plurality of second touch electrodes.

31. A display device with integrated touch screen, the display device comprising:
- a thin film transistor layer having a passivation layer;
- an organic light emitting device layer on a substrate;
- a plurality of color filters on the organic light emitting device layer;
- a black matrix overlapping a boundary portion between the plurality of color filters, the black matrix including three or more layers, wherein each of the three or more layers includes a metal material;
- a plurality of first touch electrodes and a plurality of second touch electrodes on the black matrix; and
- a first touch line connected with the plurality of first touch electrodes and a second touch line connected with the plurality of second touch electrodes,
- wherein each of the first touch line and the second touch line is connected with a pad through a contact hole exposing the passivation layer.

32. The display device of claim 1, wherein the black matrix extends from each of the first touch electrodes and the second touch electrodes.

33. The display device of claim 32, further comprising a thin film transistor layer having a passivation layer, wherein the black matrix is connected with a pad through a contact hole exposing the passivation layer.

* * * * *